(12) United States Patent
Heijna

(10) Patent No.: US 10,879,947 B1
(45) Date of Patent: Dec. 29, 2020

(54) ANTENNA NX-PLEXER IMPEDANCE MATCHING NETWORK

(71) Applicant: QUALCOMM Incorporated, San Diego, CA (US)

(72) Inventor: Roeland Heijna, Well (NL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/431,338

(22) Filed: Jun. 4, 2019

(51) Int. Cl.
| | |
|---|---|
| *H04L 5/12* | (2006.01) |
| *H04B 1/18* | (2006.01) |
| *H04B 1/00* | (2006.01) |
| *H03H 9/72* | (2006.01) |
| *H03H 7/40* | (2006.01) |
| *H03H 9/70* | (2006.01) |
| *H04B 1/04* | (2006.01) |

(52) U.S. Cl.
CPC ............ *H04B 1/18* (2013.01); *H03H 7/40* (2013.01); *H03H 9/706* (2013.01); *H03H 9/725* (2013.01); *H04B 1/0057* (2013.01); *H04B 1/0458* (2013.01)

(58) Field of Classification Search
CPC ...... H04B 1/18; H04B 1/0057; H04B 1/0458; H03H 7/40; H03H 9/706; H03H 9/725
USPC ......................................................... 375/262
See application file for complete search history.

(56) References Cited

U.S. PATENT DOCUMENTS

| | | | |
|---|---|---|---|
| 6,115,592 A * | 9/2000 | Ueda ................... | H03H 9/0576 455/307 |
| 9,356,639 B1* | 5/2016 | Chapman ................. | H04B 1/28 |
| 9,515,690 B1* | 12/2016 | Chapman .............. | H03F 1/0205 |
| 2008/0042778 A1* | 2/2008 | Jamneala ............. | H03H 9/0004 333/133 |
| 2011/0128092 A1* | 6/2011 | Fritz ..................... | H03H 9/706 333/133 |
| 2017/0244432 A1* | 8/2017 | Ranta ................... | H04B 1/0067 |
| 2017/0366164 A1* | 12/2017 | Hey-Shipton ........... | H01P 1/213 |
| 2019/0013790 A1* | 1/2019 | Ayranci ................ | H03H 7/0161 |

* cited by examiner

*Primary Examiner* — Helene E Tayong
(74) *Attorney, Agent, or Firm* — QUALCOMM Incorporated

(57) ABSTRACT

An Nx-plexer for impedance matching a set of N filters with distinct passbands to an antenna. The Nx-plexer includes a set of reactive elements or networks coupled in series between a proximal node and a distal node, wherein one or more intermediate nodes between the proximal and distal nodes separate one or more distinct pairs of the reactive elements or networks, respectively; a set of filters coupled to the proximal node, the one or more intermediate nodes, and the distal node, respectively, wherein center frequencies of passbands of the filters coupled to the proximal node, the one or more intermediate nodes, and the distal node, are staggered in a particular frequency direction, respectively, wherein the distal node is coupled to an antenna. Different variations of the aforementioned Nx-plexer are also described.

28 Claims, 13 Drawing Sheets

US 10,879,947 B1

ANTENNA NX-PLEXER IMPEDANCE MATCHING NETWORK

FIELD

Aspects of the present disclosure relate generally to an interface for impedance matching a set of filters to an antenna.

BACKGROUND

As wireless devices, such as smart phones, are configured for greater bandwidth transmission and reception, the number of frequency bands used by a wireless device has rapidly increased, particularly as carrier aggregation options are expanded. Advanced filtering technology is needed to support carrier aggregation across a wide variety of frequency bands. The various filters for supporting carrier aggregation needs to interface with an antenna. Accordingly, this disclosure relates to an Nx-plexer including an impedance matching network between N filters and an antenna.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a set of reactive elements or networks coupled in series between a proximal node and a distal node, wherein one or more intermediate nodes between the proximal and distal nodes separate one or more distinct pairs of the reactive elements or networks, respectively; a set of filters coupled to the proximal node, the one or more intermediate nodes, and the distal node, respectively, wherein center frequencies of passbands of the filters coupled to the proximal node, the one or more intermediate nodes, and the distal node, are staggered in one frequency direction, respectively, wherein the distal node is coupled to an antenna.

Another aspect of the disclosure relates to an apparatus including a set of filters coupled to a proximal node, one or more intermediate nodes, and a distal node, respectively; and a set of reactive elements or networks coupled in series between the proximal node and the distal node, wherein the one or more intermediate nodes separate one or more distinct pairs of the reactive elements or networks, respectively, wherein an in-band impedance of each of the set of filters at the node at which the filter is coupled to the distal node is rotated substantially 360 degrees in phase by one or more alternating negative and positive or positive and negative reactance values produced by the reactive elements or networks and the other filters of the set of filters.

Another aspect of the disclosure relates to an apparatus including a set of negative-reactive elements or networks coupled in series between a first proximal node and a distal node, wherein one or more of a first set of intermediate nodes between the first proximal node and the distal node separate one or more distinct pairs of the set of negative-reactive elements or networks, respectively; a first set of filters coupled to the first proximal node, the one or more intermediate nodes of the first set, and the distal node, respectively, wherein center frequencies of passbands of the first set of filters coupled to the first proximal node, the one or more intermediate nodes, and the distal node, are staggered in a positive frequency direction; a set of positive-reactive elements or networks coupled in series between a second proximal node and the distal node, wherein one or more of a second set of intermediate nodes between the second proximal node and the distal node separate one or more distinct pairs of the set of positive-reactive elements or networks, respectively; and a second set of filters coupled to the second proximal node and the one or more intermediate nodes of the second set, respectively, wherein center frequencies of passbands of the second set of filters coupled to the second proximal node and the one or more intermediate nodes are staggered in a negative frequency direction, respectively, wherein the distal node is coupled to an antenna.

Another aspect of the disclosure relates a method including transforming a first impedance at a proximal node to a second impedance at a distal node by a set of impedance rotations (clockwise or counter-clockwise) performed between the proximal node and one of a set of intermediate nodes, between one or more distinct pairs of the set of intermediate nodes, and between another of the intermediate nodes and the distal node; and filtering signals to be transmitted or received from an antenna via the proximal node, the set of intermediate nodes, and the distal node, respectively.

Another aspect of the disclosure relates an apparatus including means for transforming a first impedance at a proximal node to a second impedance at a distal node by a set of clockwise or counter-clockwise impedance rotations performed between the proximal node and one of a set of intermediate nodes, between one or more distinct pairs of the set of intermediate nodes, and between another of the intermediate nodes and the distal node; and means for filtering signals to be transmitted or received from an antenna via the proximal node, the set of intermediate nodes, and the distal node, respectively.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In the following description, the term "coupled" is construed to be "electrically coupled" meaning that a first element is coupled to a second element either directly via a physical connection of the first element to the second element or by way of an intervening element, such as a capacitor or transformer.

Figure 1:
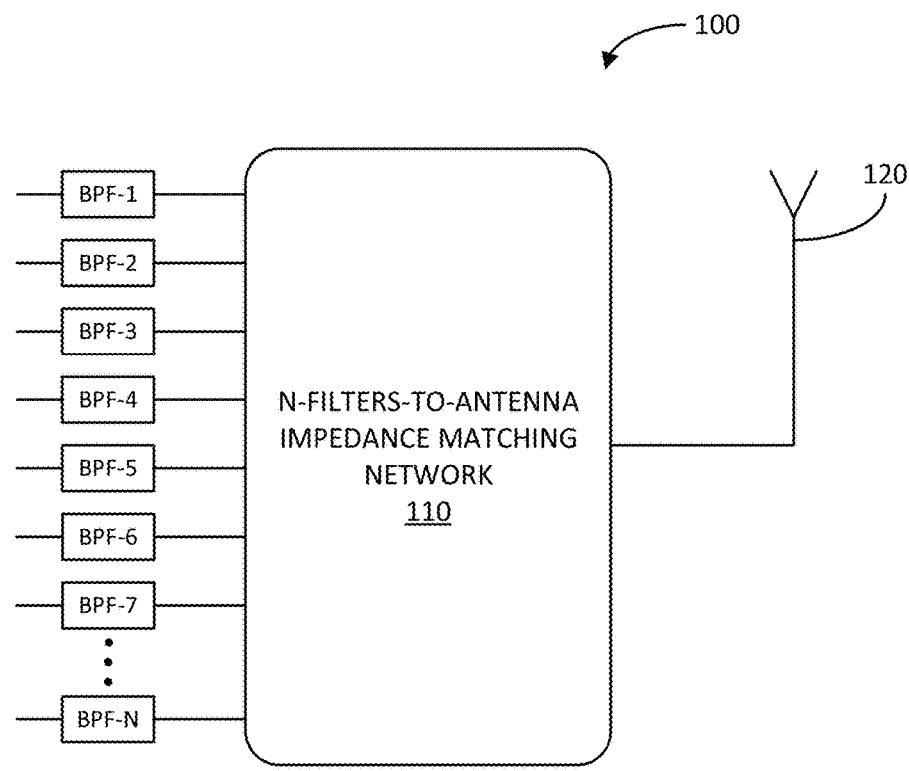
FIG. 1 illustrates a block diagram of an exemplary Nx-plexer of a wireless device in accordance with an aspect of the disclosure.

FIG. 1 illustrates a block diagram of an exemplary Nx-plexer 100 of a wireless device in accordance with an aspect of the disclosure. The Nx-plexer 100 includes a set of bandpass filters BPF-1 to BPF-N, an N-Filters-to-Antenna impedance matching network 110, and an antenna 120. The prefix "Nx" in Nx-plexer stands for the number N of bandpass filters. In the case of N=2, the Nx-plexer 100 is typically referred to as duplexer or diplexer. In the case of N=4, the Nx-plexer 100 is typically referred to as quadplexer. Although the filters described herein are referred to as bandpass filters, it shall be understood that at least one or more may be described as a high pass filter, low pass filter, or even notch filter depending on the desired frequency response in certain implementations.

The bandpass filters BPF-1 to BPF-N may be configured to have different or non-overlapping passbands or in-band frequencies with center frequencies $f_{c1}$ to $f_{cN}$. Each of the passbands of the bandpass filters BPF-1 to BPF-N accommodate a distinct carrier for transmission or reception of modulated signals via the antenna 120. Each of the bandpass filters BPF-1 to BPF-N may be configured as a bulk acoustic wave (BAW) filter, surface acoustic wave (SAW) filter, or other type of suitable filters (or a combination of BAW and/or SAW resonators with other circuit elements). BAW or SAW filters are currently desirable due to their performance, size, and cost for increasingly complex carrier aggregation frequency combinations.

As mentioned, some of the bandpass filters BPF-1 to BPF-N may be transmit filters configured to filter and provide signals to the antenna 120 for transmission to a remote wireless device, and other of the bandpass filters BPF-1 to BPF-N may be receive filters configured to filter and provide signals received from a remote wireless device via the antenna 120.

Each of the bandpass filters BPF-1 to BPF-N are optimized to provide a desired frequency response including a desired passband and reject bands. To minimize or reduce interference between the transmit and receive signals processed by the bandpass filters BPF-1 to BPF-N, the passband of the bandpass filters BPF-1 to BPF-N may not generally overlap in frequency. Further, the in-band (input or output) impedance of each of the bandpass filters BPF-1 to BPF-N are configured to present a desired characteristic or system impedance, such as substantially 50 Ohms or other value.

The impedance matching network 110 is configured to match the in-band impedances of the bandpass filters BPF-1 to BPF-N to the impedance of the antenna 120. The antenna 120 typically has a defined characteristic impedance, such as 50 Ohms or other value. Accordingly, the function of the impedance matching network 110 is to impedance match the in-band impedances (e.g., each substantially 50 Ohms) of the bandpass filters BPF-1 to BPF-N to the impedance (e.g., 50 Ohms) of the antenna 120.

When multiple signal paths through the bandpass filters BPF-1 to BPF-N are connected concurrently to the antenna 120, an impedance of one bandpass filter may be presented to the output of another. For example, if the paths through the first bandpass filter BPF-1 and the second bandpass filter BPF-2 are active concurrently, then the impedance of the second bandpass filter BPF-2 at the in-band frequency of the first bandpass filter BPF-1 may be presented to the first bandpass filter BPF-1. If more filters are connected to the antenna 120, the filters will influence each other more and more. When stepping from impedance matching a duplexer (N=2) to impedance matching a quadplexer (N=4), there may be considerable effort to find a solution that provides acceptable impedance match between the four (4) filters BPF-1 to BPF-4 and the antenna 120. The impedance matching involved in stepping from quadplexer to hexplexer (N=6 or higher), may be significantly more complicated than quadplexer. It would be desirable to find an improved solution, which makes it possible to connect various filters so that the mutual influence can be cancelled in a manageable way.

Figure 2:
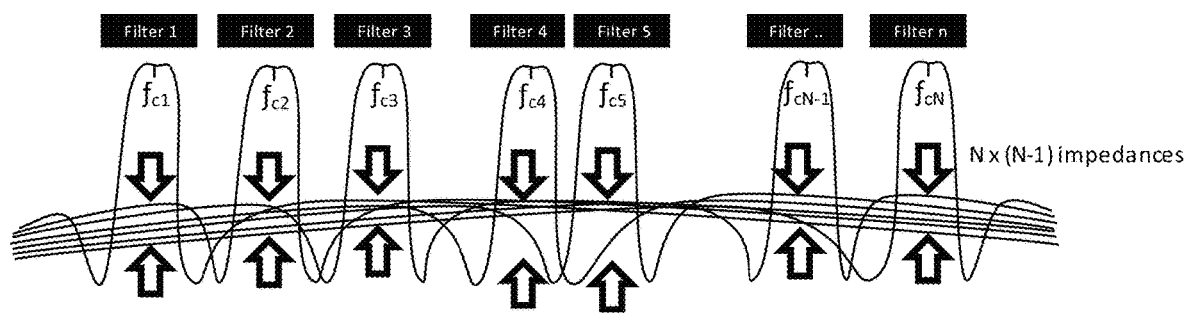
FIG. 2 illustrates a graph of exemplary frequency responses of a set of bandpass filters (BPF) of the Nx-plexer of FIG. 1 in accordance with another aspect of the disclosure.

FIG. 2 illustrates a graph of exemplary frequency responses of the set of bandpass filters BPF-1 to BPF-N of the Nx-plexer 100 in accordance with another aspect of the disclosure. The horizontal axis of the graph represents frequency, and the vertical axis of the graph represents gain. As illustrated, the center frequencies $f_{c1}$ to $f_{cN}$ of the bandpass filters BPF-1 to BPF-N are staggered in frequency from the lowest center frequency $f_{c1}$ of bandpass filter BPF-1 to the highest center frequency $f_{cN}$ of bandpass filter BPF-N. The in-band or passband of the bandpass filters BPF-1 to BPF-N are also mutually exclusive or non-overlapping to minimize or reduce interference between the signals processed by the filters.

The graph also illustrates that with N filters, each filter sees N−1 different other filter impedances. Accordingly, the impedance matching network 110 is preferably configured to ensure that the N−1 impedances each filter sees is cancelled out so that each filter operates optimally or as desired. Thus, the disclosure herein relates to connecting N filters without tuning the filter impedance away from their ideal in-band impedance.

Figure 3:
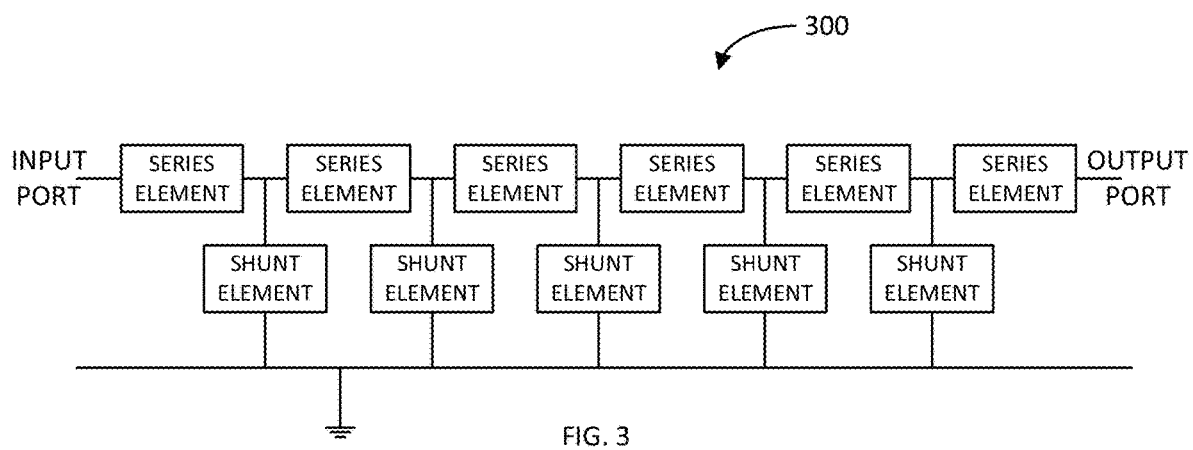
FIG. 3 illustrates a block diagram of an exemplary bandpass filter (BPF) in accordance with another aspect of the disclosure.

FIG. 3 illustrates a block diagram of an exemplary bandpass filter (BPF) 300 in accordance with another aspect of the disclosure. The BPF 300 may be a more detailed implementation of the bandpass filters BPF-1 to BPF-N. For explanation of the concepts, each of the bandpass filters described herein may have the same architecture, which includes a set of series elements (e.g., six (6)) and a set of shunt elements (e.g., five (5)). The number of series and shunt elements may vary based on the particular filter and desired frequency response. The set of series elements are coupled in series between an input port and an output port. The set of shunt elements are coupled between distinct pairs of the series elements and ground, respectively. Thus, the bandpass filters BPF-1 to BPF-N may have the same series and shunt element configuration, but are scaled to have different center frequencies and non-overlapping passbands.

Figure 4:
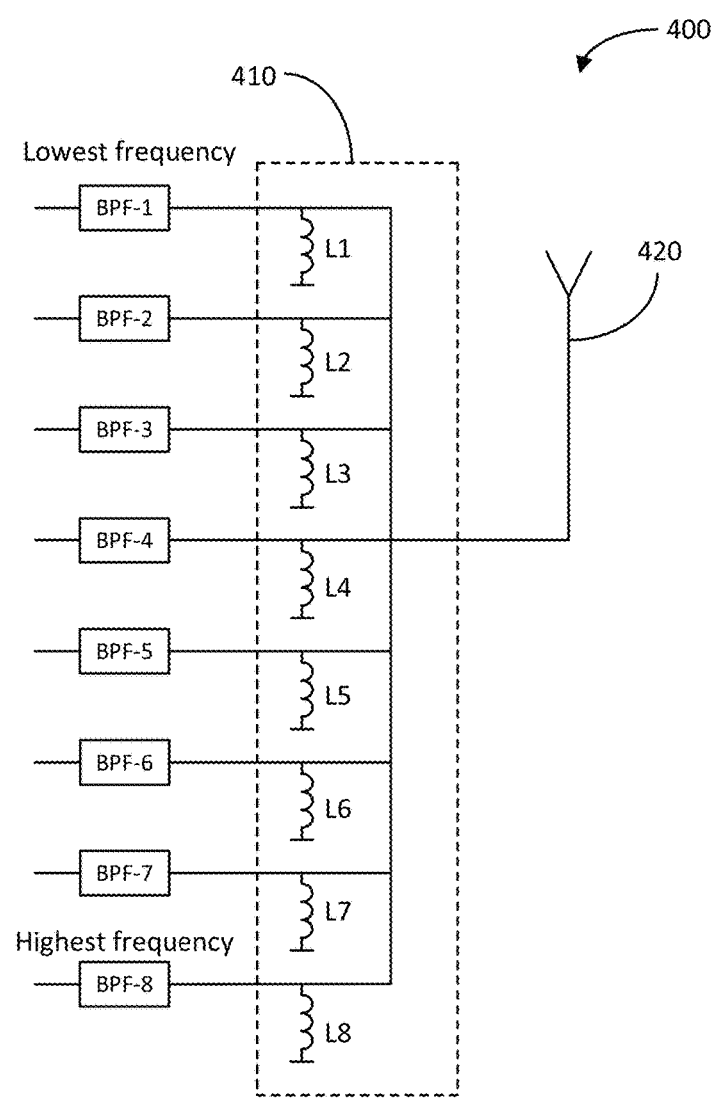
FIG. 4 illustrates a schematic diagram of another exemplary Nx-plexer of a wireless device in accordance with another aspect of the disclosure.

FIG. 4 illustrates a schematic diagram of another exemplary Nx-plexer 400 of a wireless device in accordance with another aspect of the disclosure. The Nx-plexer 400 includes a set of bandpass filters BPF-1 to BPF-8 (e.g., N=8), an impedance matching network 410, and an antenna 420. Although in this example, the Nx-plexer 400 includes eight (8) bandpass filters, it shall be understood that it may include a different number of filters. The bandpass filters BPF-1 to BPF-N are configured to have staggered center frequencies $f_{c1}$ to $f_{cN}$ with passbands from the lowest frequency passband in BPF-1 to the highest frequency passband in BPF-8.

The impedance matching network 410 includes a set of inductors L1 to L8 connected between the common filter ports and ground. As the filter ports are common, and also common with the antenna port, the eight (8) inductors may be decomposed to a single or less than eight (8) inductors as these inductors are coupled in parallel. The inductors L1 to L8 are shown as inductors to represent reactive elements for impedance matching, but it should be appreciated, they are merely representative and such impedance elements could include any manner of reactive element networks (inductors and capacitor connected in various manner), but they may often include or be configured as inductors. The following describes the problem with the impedance matching network 410.

Figure 5:
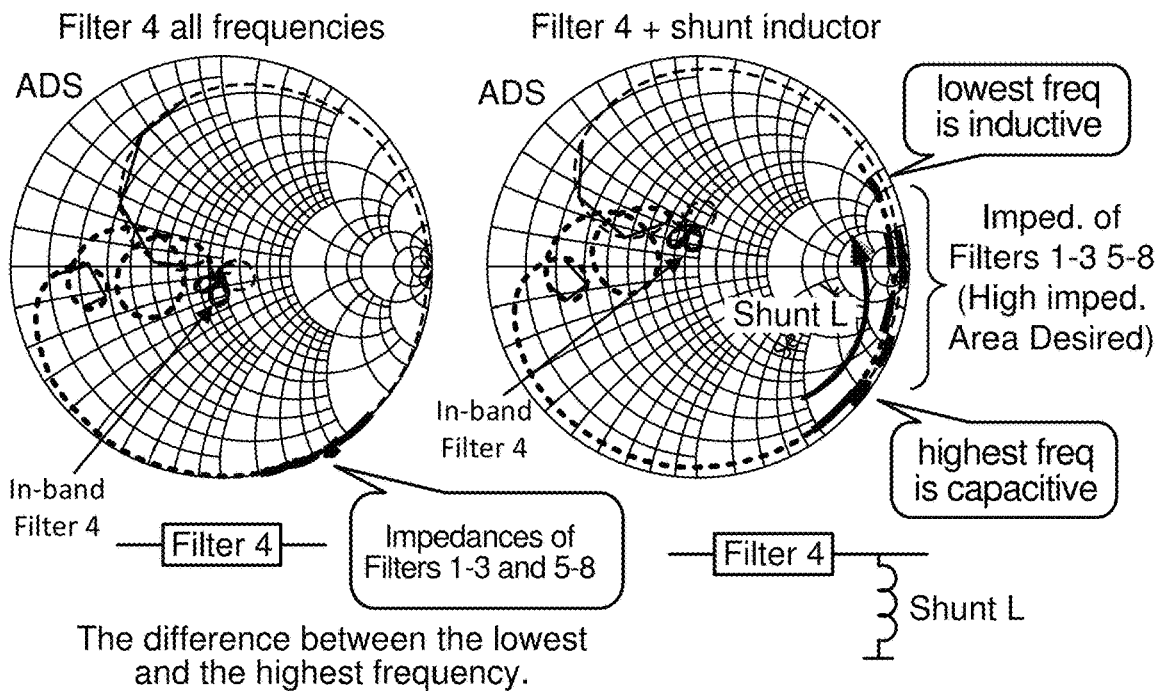
FIG. 5 illustrates a pair of exemplary Smith charts depicting impedances for the set of BPFs at the in-band frequency range of BPF-4 with and without a shunt inductor in accordance with another aspect of the disclosure.

FIG. 5 illustrates a pair of exemplary Smith charts depicting impedances for the set of BPFs at the in-band frequency range of BPF-4 with and without a shunt inductor in accordance with another aspect of the disclosure. The left Smith chart depicts the in-band impedance of bandpass filter BPF-4 (solid line near the center of the Smith chart) and the impedances of the other bandpass filters BPF-1-3 and BPF-5-8 as seen by BPF-4 (solid lines grouped near the lower-right portion of the Smith chart).

As depicted, the impedance of the bandpass filter BPF-4 is centered around the middle of the Smith chart or the normalized characteristic impedance (Z=1), which may translate to 50 Ohms or other value. The impedance of the bandpass filter BPF-4 is shown as a squiggly line around the normalized characteristic impedance (Z=1) because that represents the impedance of the passband of bandpass filter BPF-4. That is, the impedance of the passband varies a little with frequency.

The impedances of the other bandpass filters BPF-1-3 and BPF 5-8 are grouped around a negative-reactance or capacitive region near a lower-right outer perimeter region of the Smith chart. Accordingly, as seen by bandpass filter BPF-4, the other bandpass filter BPF 1-3 and BPF-5-8 are effectively capacitors.

As bandpass filter BPF-4 has the most centralized passband, the impedance matching network 410 attempts to optimize the impedance match between the bandpass filter BPF-4 and the antenna 420, while accepting reduced impedance match for the other bandpass filters BPF 1-3 and BPF-5-8. In this regard, a network of reactive components, such as an inductor or several inductors, e.g., inductors L1 to L8, are coupled between the common output of the filters BPF-1 to BPF-8 and ground.

The right Smith chart shows the effect of adding the one or more inductors L1 to L8 between the common output of the filters BPF-1 to BPF-8 and ground. Such inductor(s) has reduced effects on the in-band impedance of bandpass filter BPF-4 slightly rotating the in-band impedance counter-clockwise around the normalized characteristic impedance (Z=1). With regard to the impedances of the other bandpass filters BPF-1-3 and BPF-5-8, the inductor(s) causes the impedance to rotate counter-clockwise along the outer perimeter of the Smith chart until the impedances are situated around the open circuit region. This is done so that the other bandpass filters BPF-1-3 and BPF-5-8 look like an open circuit from the perspective of the bandpass filter BPF-4.

Figure 6:
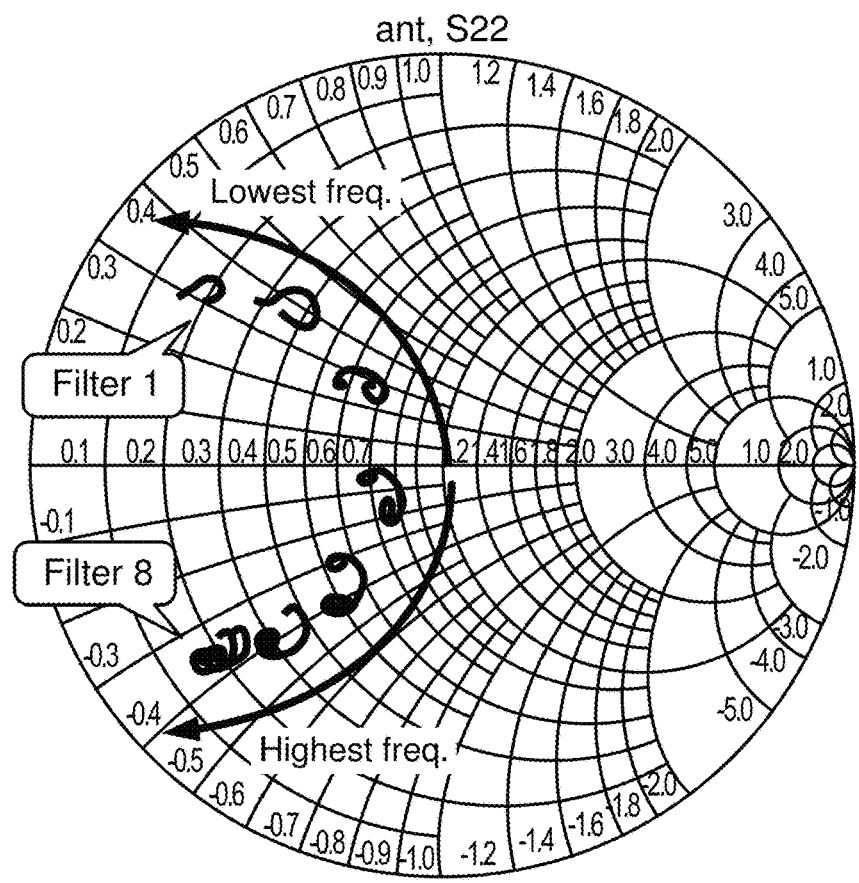
FIG. 6 illustrates an exemplary Smith chart illustrating the in-band impedances of the set of bandpass filters when they are connected in common to an antenna in accordance with another aspect of the disclosure.

FIG. 6 illustrates an exemplary Smith chart illustrating the in-band impedances of the set of bandpass filters BPF-1 to BPF-8 when they are connected in common to the antenna 420 in accordance with another aspect of the disclosure. As indicated, due to the mutual influence of the bandpass filters BPF-1 to BPF-8, the in-band impedances of the bandpass filters BPF-1 to BPF-8 are spread around a half-circle with the impedance of the lowest-frequency bandpass filter BPF-1 being at the upper end of the half-circle, and the impedance of the highest-frequency bandpass filter BPF-8 being at the lower end of the half-circle.

This indicates that the middle bandpass filter BPF-4 having an impedance near the normalized characteristic impedance (Z=1) has the best impedance match with the antenna 420 as compared to the other bandpass filters BPF-1-3 and BPF-5-8. Conversely, those bandpass filters, such as BPF-1 and BPF-8 with impedances farthest away from the normalized characteristic impedance (Z=1) have the worst impedance match with the antenna. Thus, the performance of such filters is degraded, and there will be substantially variation in the gain across the bandpass filters BPF-1 to BPF-8.

Figure 7:
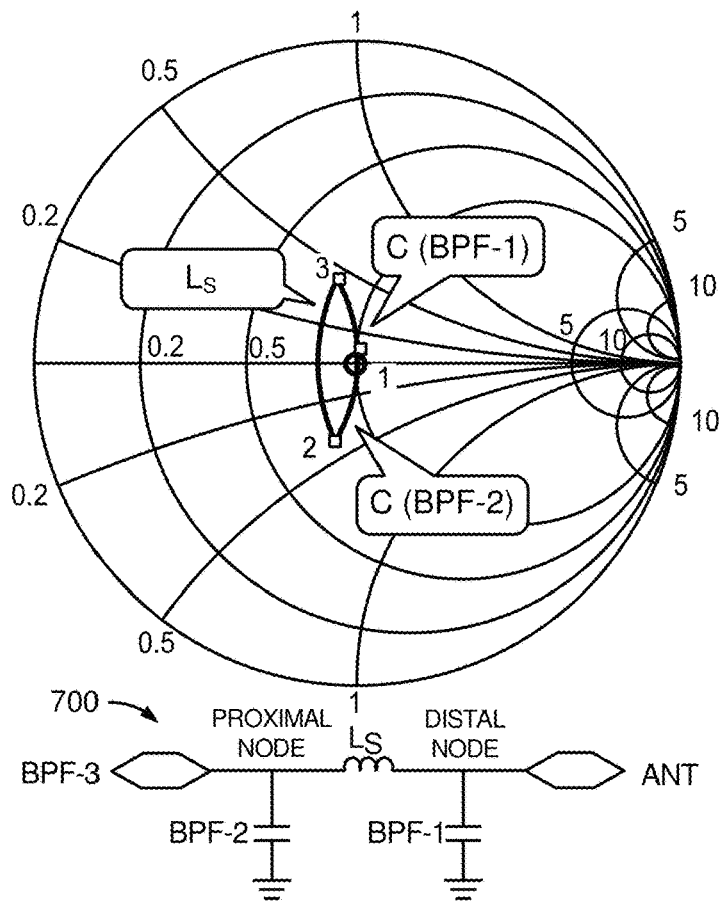
FIG. 7 illustrates an exemplary Smith chart and corresponding equivalent Nx-plexer circuit to illustrate a method of impedance matching N=3 BPFs to an antenna in accordance with another aspect of the disclosure.

FIG. 7 illustrates an exemplary Smith chart and equivalent Nx-plexer circuit 700 to illustrate a method of impedance matching N=3 BPFs to an antenna in accordance with another aspect of the disclosure. As previously discussed, the impedances of other bandpass filters as seen in-band from a bandpass filter-of-interest is generally capacitive. In this example, the Nx-plexer circuit 700 includes bandpass BPF-3 located at a proximal node or source node (node closest to the bandpass filter-of-interest). In this example, the bandpass filter BPF-3 has the highest center frequency (e.g., $f_{c3}$) among the filters BPF-1 to BPF-3.

The Nx-plexer circuit 700 represents the next bandpass filter BPF-2 as a shunt capacitor coupled between the proximal node and ground. Again, this is because the impedance of bandpass filter BPF-2 as seen in-band of BPF-3 is capacitive. The bandpass filter BPF-2 has the middle center frequency (e.g., $f_{c2}$) among the bandpass filters BPF-1 to BPF-3.

The Nx-plexer circuit 700 further includes a series inductor $L_S$ coupled between the proximal node and a distal or load node. As discussed in more detail below, the series inductor $L_S$ represents a reactive (e.g., positive) element or reactive (e.g., positive) network that is configured to perform the function of the impedance matching the bandpass filters to the antenna.

The Nx-plexer circuit 700 further includes the last bandpass filter BPF-1 as a capacitor coupled between the distal node and ground. Again, this is because the impedance of bandpass filter BPF-1 as seen in-band of BPF-3 is capacitive. The bandpass filter BPF-1 has the lowest center frequency (e.g., $f_{c1}$). The antenna (ANT) is connected to the distal node.

Referring to the associated Smith chart in FIG. 7, the in-band impedance of bandpass filter BPF-3 is at the normalized characteristic impedance (Z=1) at the center of the Smith chart. This is because the bandpass filter BPF-3 is optimized so that the in-band impedance is substantially at the characteristic impedance (e.g., Zo=50 Ohms). The normalized characteristic impedance (Z=1) is indicated as point 1 on the Smith chart.

The bandpass filter BPF-2 is coupled to the proximal node. This has the effect of introducing a shunt capacitor at the proximal node. Accordingly, due to the shunt capacitance, the impedance at the proximal node moves from the normalized characteristic impedance (Z=1) at point 1 clockwise along a constant-susceptance curve to an impedance indicated as point 2 on the Smith chart.

The series inductor $L_S$ is coupled between the proximal and distal node. The effect of the series inductor $L_S$ is to move the impedance at the proximal node from point 2 clockwise along a constant-reactance curve to point 3 on the Smith chart.

The bandpass filter BPF-1 is coupled to the distal node. This has the effect of introducing a shunt capacitor at the distal node. Accordingly, due to the shunt capacitance, the impedance at the distal node moves from the impedance at point 3 clockwise along a constant-susceptance curve to the normalized characteristic impedance at point 1 of the Smith chart.

Thus, the impedance at the distal node or antenna port is brought to the characteristic impedance of the antenna due to the series inductor $L_S$. In effect, the overall phase shift of the impedance of the bandpass filter BPF-3 is rotated substantially 360 degrees (from point 1 to point 2 to point 3 and back to point 1). This is a cumulative impedance rotation of substantially 360 degrees. The inductance value of the series inductor $L_S$ moves the impedance from point 2 to point 3. Thus, the inductance value of the series inductor $L_S$ is selected, based on the capacitances of bandpass filters BPF-2 and BPF-1 as seen in-band by bandpass filter BPF-3, to perform the desired impedance phase shift to achieve the 360-degree impedance phase shift rotation. In this example, the combination of the series inductor $L_S$ and the bandpass filters BPF-2 and BPF-3 exhibiting shunt capacitors on both sides of the series inductor $L_S$ performs the desired phase shift (e.g., in this example, 360 degrees phase shift) so that phase-shifted impedance at the antenna port substantially matches the impedance of the antenna.

Figure 8A:
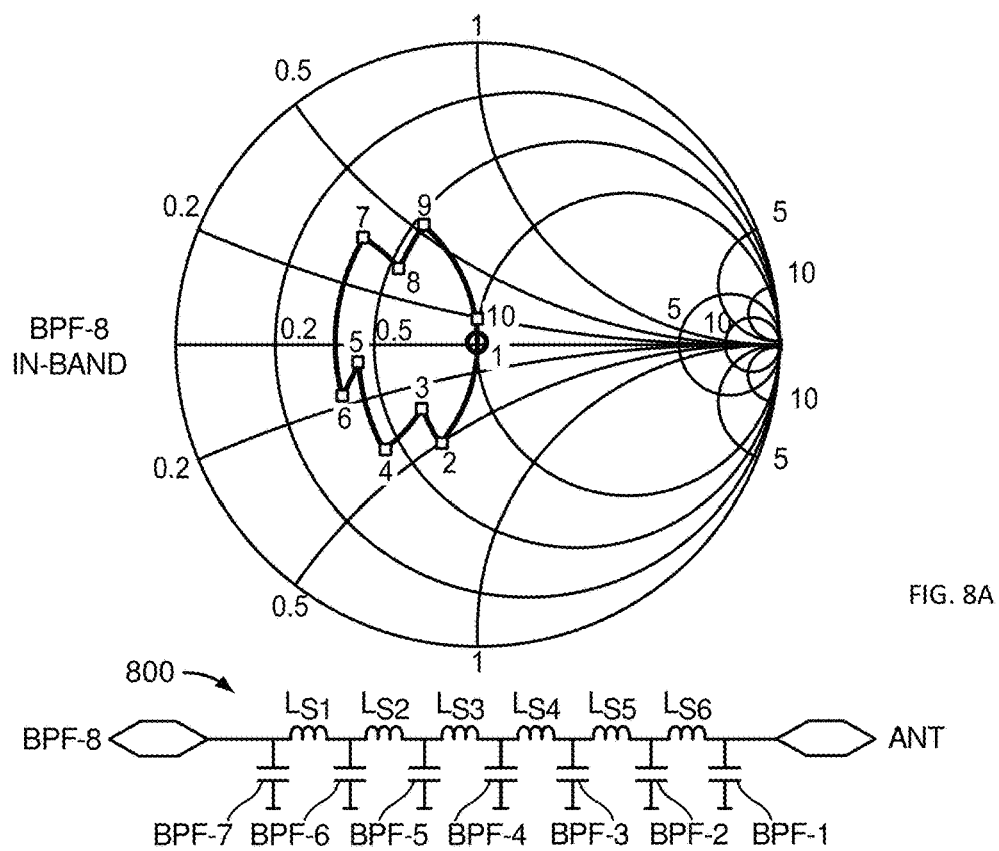
FIG. 8A illustrates an exemplary Smith chart and corresponding equivalent Nx-plexer circuit to illustrate a method of impedance matching N=8 BPFs to an antenna in accordance with another aspect of the disclosure.

FIG. 8A illustrates an exemplary Smith chart and equivalent Nx-plexer circuit 800 to illustrate a method of impedance matching N=8 BPFs to an antenna in accordance with another aspect of the disclosure. The above example of impedance matching three bandpass filters BPF-1 to BPF-3 to an antenna may be extended to any number N of bandpass filters. Accordingly, as another example, the Nx-plexer circuit 800 relates to impedance matching N=8 bandpass filters to an antenna using an Nx-plexer having six (6) series inductors $L_{S1}$ to $L_{S6}$. It shall be understood that an Nx-plexer circuit described herein may have at least four (4) filters, such as five (5) or (6) filters, for example.

The Nx-plexer circuit 800 includes bandpass filter BPF-8 located at a proximal node (node closest to the bandpass filter-of-interest). In this example, the bandpass filter BPF-8 has the highest center frequency (e.g., $f_{c8}$). As indicated below, the center frequencies of the bandpass filters from BPF-8 to BPF-1 is monotonically decreasing.

The Nx-plexer circuit 800 further includes the next bandpass filter BPF-7 as a capacitor coupled between the proximal node and ground. Again, this is because the impedance of bandpass filter BPF-7 as seen in-band of BPF-8 is capacitive. The bandpass filter BPF-7 has a center frequency (e.g., $f_{c7}$) lower than the center frequency of bandpass filters BPF-8 (e.g., $f_{c7} < f_{c8}$).

The Nx-plexer circuit 800 further includes a first series inductor $L_{S1}$ coupled between the proximal node and a first intermediate node, i.e., a node between the proximal and distal nodes. The first series inductor $L_{S1}$ is part of the impedance matching network. The Nx-plexer circuit 800 further includes a bandpass filter BPF-6 as a capacitor coupled between the first intermediate node and ground. Again, this is because the impedance of bandpass filter BPF-6 as seen in-band of BPF-8 is capacitive. The bandpass filter BPF-6 has the center frequency (e.g., $f_{c6}$) lower than the center frequency of bandpass filter BPF-7 (e.g., $f_{c6} < f_{c7}$).

The Nx-plexer circuit 800 further includes a second series inductor $L_{S2}$ coupled between the first intermediate node and a second intermediate node. The second series inductor $L_{S2}$ is also part of the impedance matching network. The Nx-plexer circuit 800 further includes a bandpass filter BPF-5 as a capacitor coupled between the second intermediate node and ground. Again, this is because the impedance of bandpass filter BPF-5 as seen in-band of BPF-8 is capacitive. The bandpass filter BPF-5 has a center frequency (e.g., $f_{c5}$) lower than the center frequency of bandpass filter BPF-6 (e.g., $f_{c5} < f_{c6}$).

The Nx-plexer circuit 800 further includes a third series inductor $L_{S3}$ coupled between the second intermediate node and a third intermediate node. The third series inductor $L_{S3}$ is also part of the impedance matching network. The Nx-plexer circuit 800 further includes a bandpass filter BPF-4 as a capacitor coupled between the third intermediate node and ground. Again, this is because the impedance of bandpass filter BPF-4 as seen in-band of BPF-8 is capacitive. The bandpass filter BPF-4 has a center frequency (e.g., $f_{c4}$) lower than the center frequency of bandpass filter BPF-5 (e.g., $f_{c4} < f_{c5}$).

The Nx-plexer circuit 800 further includes a fourth series inductor $L_{S4}$ coupled between the third intermediate node and a fourth intermediate node. The fourth series inductor $L_{S4}$ is also part of the impedance matching network. The Nx-plexer circuit 800 further includes a bandpass filter BPF-3 as a capacitor coupled between the fourth intermediate node and ground. Again, this is because the impedance of bandpass filter BPF-3 as seen in-band of BPF-8 is capacitive. The bandpass filter BPF-3 has a center frequency (e.g., $f_{c3}$) lower than the center frequency of bandpass filter BPF-4 (e.g., $f_{c3} < f_{c4}$).

The Nx-plexer circuit 800 further includes a fifth series inductor $L_{S5}$ coupled between the fourth intermediate node and a fifth intermediate node. The fifth series inductor $L_{S5}$ is part of the impedance matching network. The Nx-plexer circuit 800 further includes a bandpass filter BPF-2 as a capacitor coupled between the fifth intermediate node and ground. Again, this is because the impedance of bandpass filter BPF-2 as seen in-band of BPF-8 is capacitive. The bandpass filter BPF-2 has a center frequency (e.g., $f_{c2}$) lower than the center frequency of bandpass filter BPF-3 (e.g., $f_{c3} < f_{c2}$).

The Nx-plexer circuit 800 further includes a sixth series inductor $L_{S6}$ coupled between the fifth intermediate node and the distal node or antenna port. The sixth series inductor $L_{S6}$ is part of the impedance matching network. The Nx-plexer circuit 800 further includes a bandpass filter BPF-1 as a capacitor coupled between the distal node and ground. Again, this is because the impedance of bandpass filter BPF-1 as seen in-band of BPF-8 is capacitive. The bandpass filter BPF-1 has a center frequency (e.g., $f_{c1}$) lower than the center frequency of bandpass filter BPF-2 (e.g., $f_{c1} < f_{c2}$). The antenna (ANT) is connected to the distal node.

Referring to the associated Smith chart in FIG. 8, the in-band impedance of bandpass filter BPF-8 is at the normalized characteristic impedance (Z=1) at the center of the Smith chart. This is because the bandpass filter BPF-8 is optimized so that the in-band impedance is substantially at the characteristic impedance (e.g., Zo=50 Ohms). The normalized characteristic impedance (Z=1) is indicated at point 1 on the Smith chart.

The bandpass filter BPF-7 is coupled to the proximal node. This has the effect of introducing a shunt capacitor at the proximal node. Accordingly, due to the shunt capacitance, the impedance at the proximal node moves from the normalized characteristic impedance (Z=1) at point 1 clockwise along a constant-susceptance curve to an impedance indicated at point 2 on the Smith chart.

The first series inductor $L_{S1}$ is coupled between the proximal and the first intermediate node. The effect of the first series inductor $L_{S1}$ is to move the impedance at the proximal node from point 2 clockwise along a constant-reactance curve to impedance indicated at point 3 on the Smith chart.

The bandpass filter BPF-6 is coupled to the first intermediate node. This has the effect of introducing a shunt capacitor at the first intermediate node. Accordingly, due to the shunt capacitance, the impedance at the first intermediate node moves from the impedance at point 3 clockwise along a constant-susceptance curve to impedance indicated at point 4 on the Smith chart.

The second series inductor $L_{S2}$ is coupled between the first intermediate node and the second intermediate node. The effect of the second series inductor $L_{S2}$ is to move the impedance at the first intermediate node from point 4 clockwise along a constant-reactance curve to impedance indicated at point 5 on the Smith chart.

The filter BPF-5 is coupled to the second intermediate node. This has the effect of introducing a shunt capacitor at the second intermediate node. Accordingly, due to the shunt capacitance, the impedance at the second intermediate node moves from the impedance at point 5 clockwise along a constant-susceptance curve to impedance indicated at point 6 on the Smith chart.

The third series inductor $L_{S3}$ is coupled between the second intermediate node and the third intermediate node. The effect of the third series inductor $L_{S3}$ is to move the impedance at the second intermediate node from point 6 clockwise along a constant-reactance curve to impedance indicated at point 7 on the Smith chart.

The filter BPF-4 is coupled to the third intermediate node. This has the effect of introducing a shunt capacitor at the third intermediate node. Accordingly, due to the shunt capacitance, the impedance at the third intermediate node moves from the impedance at point 7 clockwise along a constant-susceptance curve to impedance indicated at point 8 on the Smith chart.

The fourth series inductor $L_{S4}$ is coupled between the third intermediate node and the fourth intermediate node. The effect of the fourth series inductor $L_{S4}$ is to move the impedance at the third intermediate node from point 8 clockwise along a constant-reactance curve to impedance indicated at point 9 on the Smith chart.

The filter BPF-3 is coupled to the fourth intermediate node. This has the effect of introducing a shunt capacitor at the fourth intermediate node. Accordingly, due to the shunt capacitance, the impedance at the fourth intermediate node moves from the impedance at point 9 clockwise along a constant-susceptance curve to impedance indicated at point 10 on the Smith chart.

The last two series inductors $L_{S5}$ and $L_{S6}$, and bandpass filters BPF-2 and BPF-1 perform the final phase rotations such that the impedance at the distal node or antenna port is substantially at the normalized characteristic impedance (Z=1). Since, as seen in the Smith chart, the impedance changes between the impedance at point 10 and the normalized characteristic impedance (Z=1) is relatively small, one or more of the series inductor $L_{S5}$ and $L_{S6}$ may be eliminated to reduce component count.

Thus, the impedance at the distal node or antenna port is brought to the characteristic impedance of the antenna due to the set of series inductors $L_{S1}$ to $L_{S6}$. In effect, the overall phase shift of the impedance of the bandpass filter BPF-8 is rotated substantially 360 degrees (from point 1 to point 10 and back to point 1). The inductance value of the series inductors $L_{S1}$ to $L_{S6}$ moves the impedance from points 2 to 3, 4 to 5, 6 to 7, 8 to 9, and small positive-constant-reactance increments beyond point 10, respectively. Thus, the inductance values of the series inductor $L_{S1}$ to $L_{S6}$ are selected, based on the capacitances of bandpass filters BPF-7 and BPF-1 as seen in-band by bandpass filter BPF-8, to perform the desired impedance rotation to achieve the 360-degree impedance rotation.

In this example, the combination of the set of series inductors $L_{S1}$ to $L_{S6}$ and the set of bandpass filters BPF-7 to BPF-1 exhibiting shunt capacitors perform the desired phase shift (e.g., substantially 360 degrees phase shift) so that impedance at the antenna port matches the impedance of the antenna. As illustrated, the series inductor $L_{S3}$ produces an impedance shifts that crosses the real value or capacitive-to-inductor line.

It shall be understood that each of the series inductors $L_{S1}$ to $L_{S6}$ represents a reactive element (e.g., positive) or reactive (e.g., positive) network that is configured to perform the function of the impedance matching the bandpass filters to the antenna. In this example, due to the center frequencies of the bandpass filters BPF-8 towards BPF-1 monotonically decreasing, the inductance values of the series inductors LS1 towards LS6 may monotonically increase. Similarly, the out-of-band capacitances of the bandpass filters BPF-8 towards BPF-1 also may monotonically increase.

Figure 8B:
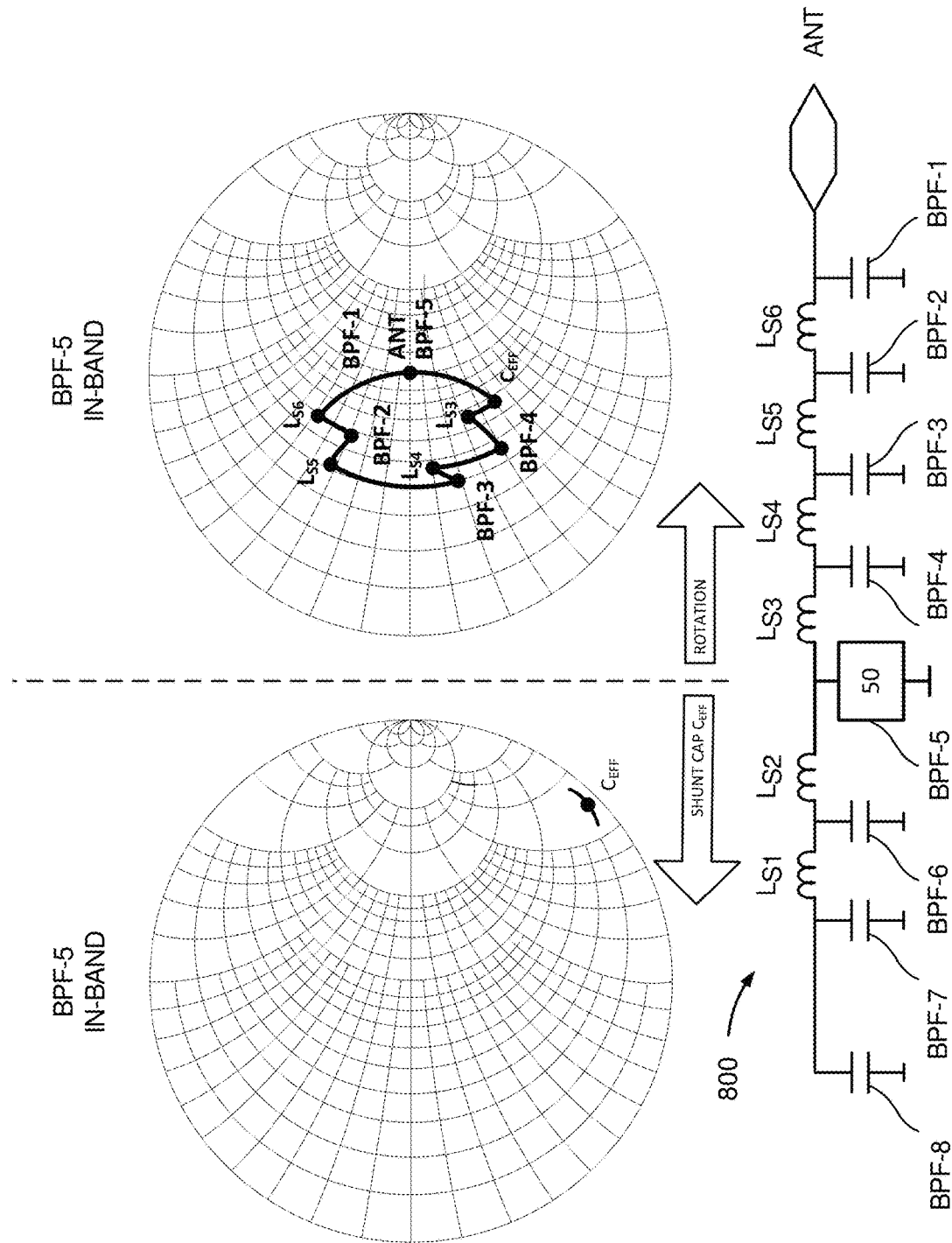
FIG. 8B illustrates exemplary Smith charts and corresponding equivalent Nx-plexer circuit to illustrate a method of impedance matching a specific bandpass filter to an antenna in accordance with another aspect of the disclosure.

FIG. 8B illustrates exemplary Smith charts and corresponding equivalent Nx-plexer circuit 800 to illustrate the method of impedance matching the bandpass filters to the antenna from the perspective of bandpass filter BPF-5 in accordance with another aspect of the disclosure. The inductances of the series inductors $L_{S1}$ to $L_{S6}$ derived as discussed above should perform substantially the same 360 impedance rotation for the in-bands of the other bandpass filters BPF-7 to BPF-2. Note, no impedance rotation is needed for bandpass filter BPF-1 because it is configured to have a normalized characteristic impedance of Z=1 (e.g., 50 Ohms) at the distal node. To illustrate this, the rotation of the in-band impedance of bandpass filter BPF-5 is now considered.

As discussed, the bandpass filter BPF-5 is coupled between the second intermediate node and ground. The bandpass filter BPF-5 presents an impedance at the second intermediate node that is at the normalized characteristic impedance (Z=1) (e.g., 50 Ohms) at the in-band of bandpass filter BPF-5. Thus, as indicated by the Smith chart to the right (or in the direction towards the distal or antenna node) of the bandpass filter BPF-5, the impedance of the bandpass filter BPF-5 is indicated at the normalized characteristic impedance point (Z=1) (as well as the impedance at the antenna or distal node due to the impedance rotation for in-band of bandpass filter BPF-5).

From the perspective of the in-band of bandpass filter BPF-5, the circuit network consisting of bandpass filters BPF-8 to BPF-6, and series inductors $L_{S1}$ and $L_{S2}$ to the left of the bandpass filter BPF-5 has an effective shunt capacitance $C_{EFF}$ at the second intermediate node. This is illustrated by the Smith chart on the left (or in the direction away from the distal or antenna node) of the bandpass filter BPF-5, where the impedance is near the perimeter of the Smith chart in the negative-reactance or capacitance region. As indicated in the right Smith chart, the effective shunt capacitance $C_{EFF}$ moves the in-band impedance of the bandpass filter BPF-5 from the characteristic impedance point (Z=1) clockwise along a constant-susceptance curve.

The elements to the right (or in the direction towards the distal or antenna node) perform the 360-impedance rotation of the in-band impedance of bandpass filter BPF-5 so that it is at substantially the normalized characteristic impedance point (Z=1) at the distal or antenna node. For instance, the series inductor $L_{S3}$ rotates the in-band impedance of bandpass filter BPF-5 at the second intermediate node clockwise along a constant-reactance curve. The capacitance of the bandpass filter BPF-4 at the in-band frequency of the bandpass filter BPF-5 moves the impedance at the third intermediate node clockwise along a constant-susceptance curve.

The series inductor $L_{S4}$ rotates the in-band impedance of bandpass filter BPF-5 at the third intermediate node clockwise along a constant-reactance curve. The capacitance of the bandpass filter BPF-3 at the in-band frequency of the bandpass filter BPF-5 moves the impedance at the fourth intermediate node clockwise along a constant-susceptance curve. The series inductor $L_{S5}$ rotates the in-band impedance of bandpass filter BPF-5 at the fourth intermediate node clockwise along a constant-reactance curve. The capacitance of the bandpass filter BPF-2 at the in-band frequency of the bandpass filter BPF-5 moves the impedance at the fifth intermediate node clockwise along a constant-susceptance curve.

The series inductor $L_{S6}$ rotates the in-band impedance of bandpass filter BPF-5 at the fifth intermediate node clockwise along a constant-reactance curve. The capacitance of the bandpass filter BPF-1 at the in-band frequency of the bandpass filter BPF-5 moves the impedance at the distal or antenna node clockwise along a constant-susceptance curve, to bring the impedance back to substantially the normalized characteristic impedance (Z=1). As discussed below in more detail, substantially the same 360-degree impedance rotation occurs for the in-band of the other bandpass filters except for bandpass filter BPF-1, which is coupled to the distal node.

Figure 8C:
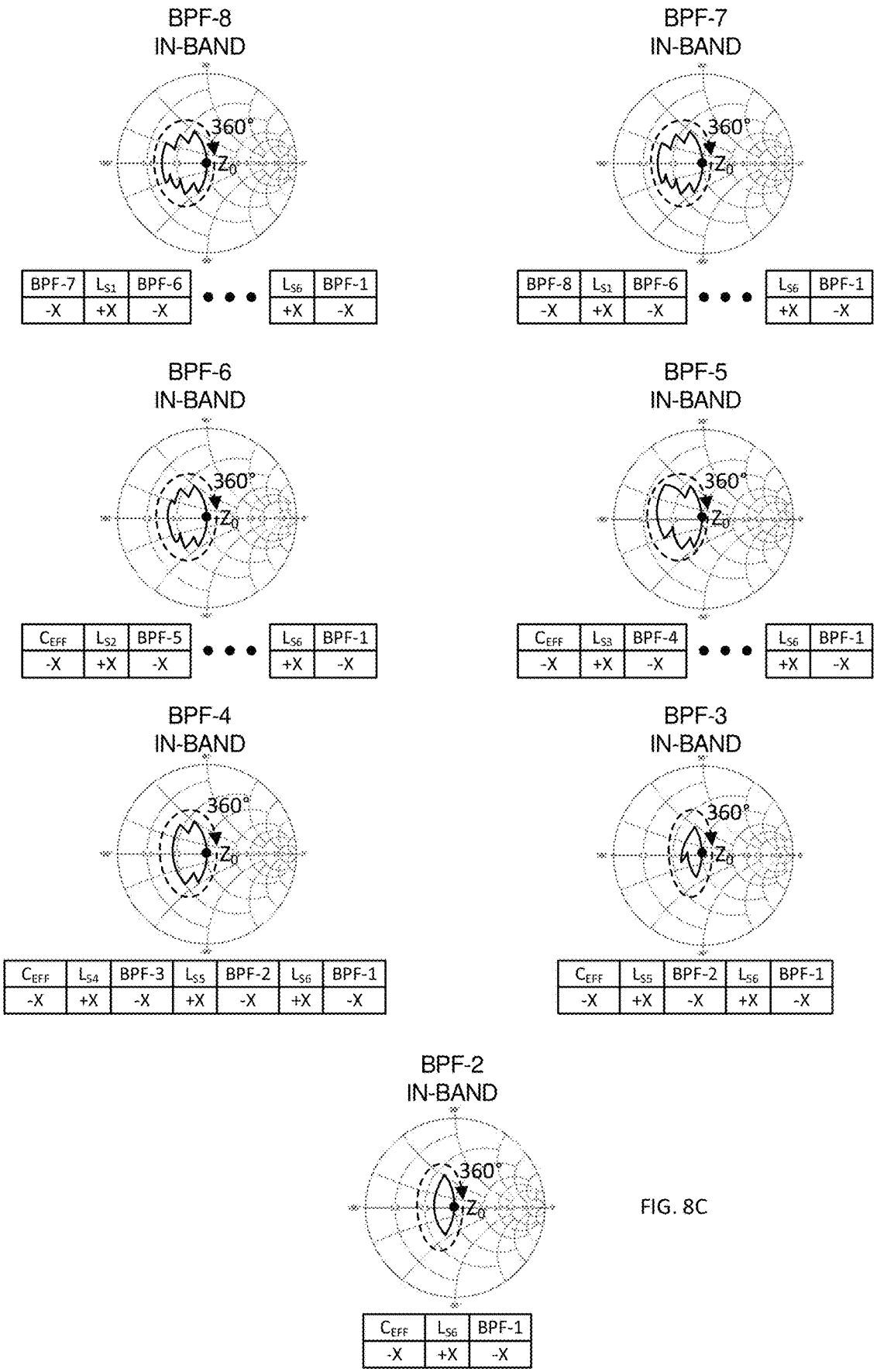
FIG. 8C illustrates exemplary Smith charts and corresponding tables of reactance changes related to a method of impedance matching bandpass filters to an antenna in accordance with another aspect of the disclosure.

FIG. 8C illustrates exemplary Smith charts and corresponding tables of reactance changes related to the method of impedance matching N=8 BPFs to the antenna in accordance with another aspect of the disclosure. The top-left Smith chart corresponds to the 360-degree impedance rotation for the in-band of bandpass filter BPF-8. The corresponding table situated below the Smith chart illustrates that the 360-degree impedance rotation begins with a negative-reactance change by bandpass filter BPF-7, then a positive-reactance change by series inductor $L_{S1}$, then another negative-reactance change by bandpass filter BPF-6, and so on, to the last positive- and negative reactance changes by series inductor $L_{S6}$ and bandpass filter BPF-1, respectively. Thus, the 360-degree rotation of the in-band impedance of bandpass filter BPF-8 is the result of alternating negative and positive reactance changes.

Similarly, the top-right Smith chart corresponds to the 360-degree impedance rotation for the in-band of bandpass filter BPF-7. The corresponding table situated below the Smith chart illustrates that the 360-degree impedance rotation begins with a negative-reactance change by bandpass filter BPF-8, then a positive-reactance change by series inductor $L_{S1}$, then another negative-reactance change by bandpass filter BPF-6, and so on, to the last positive- and negative reactance changes by series inductor $L_{S6}$ and bandpass filter BPF-1, respectively. Thus, the 360-degree rotation of the in-band impedance of bandpass filter BPF-7 is the result of alternating negative and positive reactance changes.

In a similar manner, the second-from-the-top-right Smith chart corresponds to the 360-degree impedance rotation for the in-band of bandpass filter BPF-6. The corresponding table situated below the Smith chart illustrates that the 360-degree impedance rotation begins with a negative-reactance change by the effective shunt capacitance $C_{EFF}$ of the circuit network consisting of bandpass filters BPF-7 and BPF-8 and the series inductor $L_{S1}$, then a positive-reactance change by series inductor $L_{S2}$, then another negative-reactance change by bandpass filter BPF-5, and so on, to the last positive- and negative reactance changes by series inductor $L_{S6}$ and bandpass filter BPF-1, respectively. Thus, the 360-degree rotation of the in-band impedance of bandpass filter BPF-6 is the result of alternating negative and positive reactance changes.

Likewise, the second-from-the-top-left Smith chart corresponds to the 360-degree impedance rotation for the in-band of bandpass filter BPF-5. The corresponding table situated below the Smith chart illustrates that the 360-degree impedance rotation begins with a negative-reactance change by the effective shunt capacitance $C_{EFF}$ of the circuit network consisting of bandpass filters BPF-6 to BPF-8 and the series inductors $L_{S1}$ and $L_{S2}$, then a positive-reactance change by series inductor $L_{S3}$, then another negative-reactance change by bandpass filter BPF-4, and so on, to the last positive- and negative reactance changes by series inductor $L_{S6}$ and bandpass filter BPF-1, respectively. Thus, the 360-degree rotation of the in-band impedance of bandpass filter BPF-5 is the result of alternating negative and positive reactance changes.

The third-from-the-top-left Smith chart corresponds to the 360-degree impedance rotation for the in-band of bandpass filter BPF-4. The corresponding table situated below the Smith chart illustrates that the 360-degree impedance rotation begins with a negative-reactance change by the effective shunt capacitance $C_{EFF}$ of the circuit network consisting of bandpass filters BPF-5 to BPF-8 and the series inductors $L_{S1}$ to $L_{S3}$, then a positive-reactance change by series inductor $L_{S4}$, then another negative-reactance change by bandpass filter BPF-3, and so on, to the last positive- and negative reactance changes by series inductor $L_{S6}$ and bandpass filter BPF-1, respectively. Thus, the 360-degree rotation of the in-band impedance of bandpass filter BPF-4 is the result of alternating negative and positive reactance changes.

The third-from-the-top-right Smith chart corresponds to the 360-degree impedance rotation for the in-band of bandpass filter BPF-3. The corresponding table situated below the Smith chart illustrates that the 360-degree impedance rotation begins with a negative-reactance change by the effective shunt capacitance $C_{EFF}$ of the circuit network consisting of bandpass filters BPF-4 to BPF-8 and the series inductors $L_{S1}$ to $L_{S4}$, then a positive-reactance change by series inductor $L_{S5}$, then another negative-reactance change by bandpass filter BPF-2, then the last positive- and negative reactance changes by series inductor $L_{S6}$ and bandpass filter BPF-1, respectively. Thus, the 360-degree rotation of the in-band impedance of bandpass filter BPF-3 is the result of alternating negative and positive reactance changes.

The bottom-middle Smith chart corresponds to the 360-degree impedance rotation for the in-band of bandpass filter BPF-2. The corresponding table situated below the Smith chart illustrates that the 360-degree impedance rotation begins with a negative-reactance change by the effective shunt capacitance $C_{EFF}$ of the circuit network consisting of bandpass filters BPF-3 to BPF-8 and the series inductors $L_{S1}$ to $L_{S5}$, then a positive-reactance change by series inductor $L_{S6}$, and then another negative-reactance change by bandpass filter BPF-1. Thus, the 360-degree rotation of the in-band impedance of bandpass filter BPF-2 is the result of alternating negative and positive reactance changes.

Another way to characterize the impedance matching is that a phase shift is needed between all the filters to compensate for the difference in frequency between the filters. Each phase shifter is then a shunt capacitor-series inductor-shunt capacitor (C-L-C) combination. Without these phase shifters, the in-band impedances of filters BPF-2 to BPF-8, due to their increasing center frequencies, successively move further away from the normalized characteristic impedance (Z=1) generally in the clockwise constant-susceptance direction. Accordingly, the phase shifters successively move the in-band impedances of the filters BPF-8 to BPF-1 back to substantially the normalized characteristic impedance (Z=1).

Figure 9:
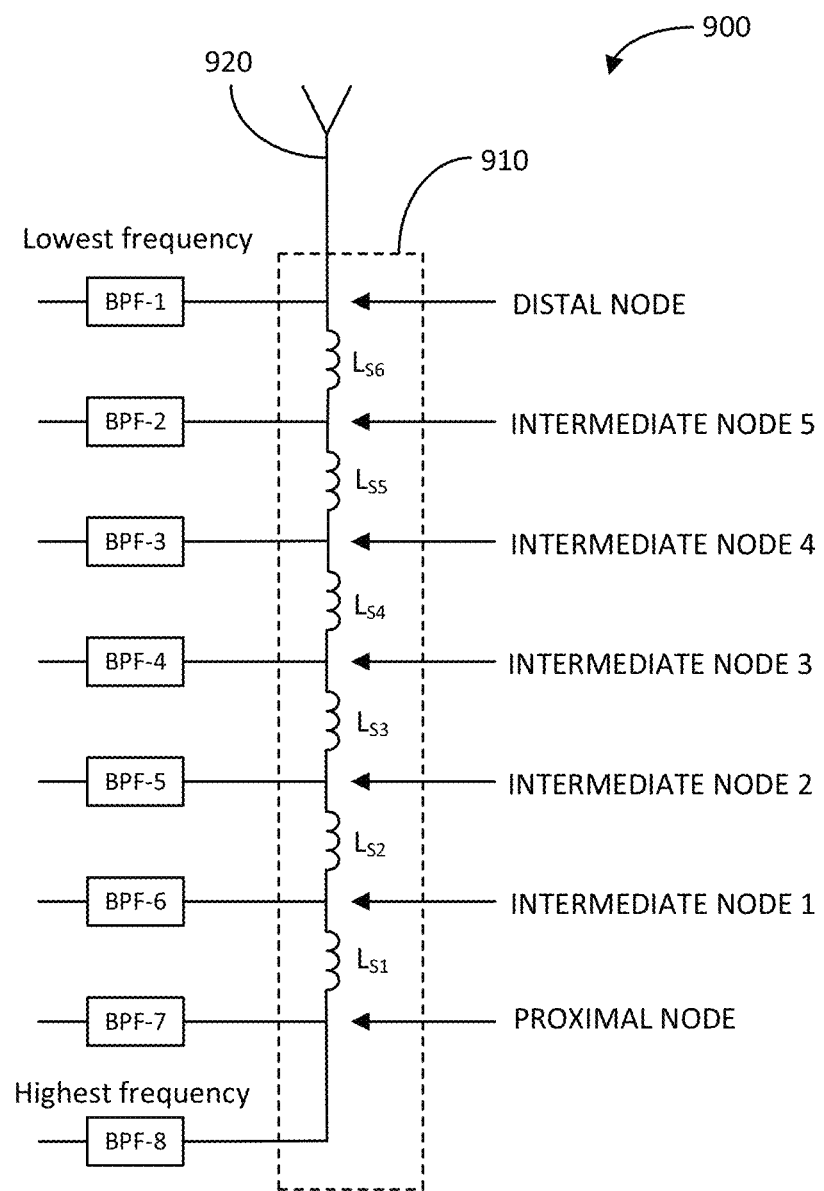
FIG. 9 illustrates a schematic diagram of another exemplary Nx-plexer of a wireless device in accordance with another aspect of the disclosure.

FIG. 9 illustrates a schematic diagram of another exemplary Nx-plexer 900 of a wireless device in accordance with another aspect of the disclosure. The Nx-plexer 900 is based on the impedance matching method described with reference to FIGS. 8A-8C.

The Nx-plexer 900 includes a set of bandpass filters BPF-1 to BPF-8 having passbands or center frequencies staggered in a positive frequency direction, wherein BPF-1 has the lowest center frequency and the BPF-8 has the highest center frequency. Although, in this example, the Nx-plexer 900 includes eight (8) bandpass filters, it shall be understood that the Nx-plexer may include a different number of bandpass filters. Some of the bandpass filters may be transmit filters configured to filter a transmit signal for transmission via an antenna 920, and others may be receive filters configured to filter a receive signal received via the antenna.

The Nx-plexer 900 further includes an impedance matching network 910 including a set of series inductors $L_{S1}$ to $L_{S6}$ coupled in series between a proximal node and a distal node, with intermediate nodes 1-5 separating distinct pairs of the series inductors $L_{S1}$-$L_{S2}$, $L_{S2}$-$L_{S3}$, $L_{S3}$-$L_{S4}$, $L_{S4}$-$L_{S5}$, and $L_{S5}$-$L_{S6}$, respectively. The bandpass filters BPF-8-7 to BPF-1 are coupled to the proximal node, intermediate nodes 1-5, and distal node, respectively. Note, although the bandpass filter BPF-8 and another filter BPF-7 have passband center frequencies that differ, they may be coupled to the same node (e.g., the center frequencies of the passbands of the filters coupled to the proximal node differ). Also note that the frequency direction of the center frequencies of the bandpass filters BPF-8 to BPF-1 is in a decreasing frequency direction.

The antenna 920 is coupled to the distal node, which may serve as the antenna port. Again, it shall be understood that each of the series inductors $L_{S1}$ to $L_{S6}$ represents a reactive element (e.g., positive) or reactive (e.g., positive) network that is configured to perform the function of the impedance matching the bandpass filters to the antenna. Although, in this example, the proximal node is coupled to the filter furthest away from the distal node, it shall be understood that the proximal node could be defined as being one of the intermediate nodes illustrated in FIG. 9.

As discussed with reference to the example of FIGS. 8A-8C, each section including a series inductor with two filters on each side of the series inductor is configured to perform an impedance phase rotation. For instance, the bandpass filter BPF-7, series inductor $L_{S1}$, and bandpass filter BPF-6 are configured to perform a first phase rotation of the in-band impedance of the bandpass filter BPF-8 at the proximal node. The bandpass filter BPF-6, series inductor $L_{S2}$, and bandpass filter BPF-5 are configured to perform a second impedance phase rotation of the BPF-8 in-band impedance at the intermediate node 1. The bandpass filter BPF-5, series inductor $L_{S3}$, and bandpass filter BPF-4 are configured to perform a third impedance phase rotation of the BPF-8 in-band impedance at the intermediate node 2.

The bandpass filter BPF-4, series inductor $L_{S4}$, and bandpass filter BPF-3 are configured to perform a fourth impedance phase rotation of the BPF-8 in-band impedance at the intermediate node 3. The bandpass filter BPF-3, series inductor $L_{S5}$, and bandpass filter BPF-2 are configured to perform a fifth impedance phase rotation of the BPF-8 in-band impedance at the intermediate node 4. The bandpass filter BPF-2, series inductor $L_{S6}$, and bandpass filter BPF-1 are configured to perform a sixth impedance phase rotation of the BPF-8 in-band impedance at the intermediate node 5. The total sum of the impedance phase rotations is substantially 360 degrees so that the impedance at the distal node or antenna port is substantially the same as the in-band impedance of BPF-8. By "substantially the same", the impedance at the distal node or antenna port is within a predefined tolerance of the in-band impedance of BPF-8.

In summary, the impedance of the bandpass filter BPF-8 may be substantially at the normalized characteristic impedance (Z=1) at the center of the Smith chart. The bandpass filter BPF-7 rotates that impedance clockwise along a constant susceptance curve; the first series inductor $L_{S1}$ rotates the impedance clockwise along a constant reactance curve; the bandpass filter BPF-6 further rotates that impedance clockwise along a constant susceptance curve; the second series inductor $L_{S2}$ further rotates the impedance clockwise along a constant reactance curve; and so on until the cumulative phase rotation is substantially 360 degrees, and the impedance presented at the distal node or the antenna port is substantially at the normalized characteristic impedance (Z=1). Thus, the impedance matching network 910 performs impedance match between the bandpass filters BPF-1 to BPF-N and an antenna 920.

Using the above method and configuration, the selected inductances for the set of series inductors $L_{S1}$ to $L_{S6}$ substantially match the in-band impedance of bandpass filter BPF-8 to the impedance of the antenna 920. However, the selected inductances for the set of series inductors $L_{S1}$ to $L_{S6}$ may not, with the same precision as for bandpass filter BPF-8, substantially match the in-band impedances of the other filters BPF-1 to BPF-7 to the impedance of the antenna. In other words, once the values of the inductors $L_{S1}$ to $L_{S6}$ are selected for substantially matching the in-band impedance of bandpass filter BPF-8 to the antenna, similar 360 in-band impedance rotations should be performed for the remaining bandpass filters BPF-1 to BPF-7. In this regard, it may be determined that the values of the series inductors $L_{S1}$ to $L_{S6}$ may not fully optimize the in-band impedance matching for the other bandpass filters BPF-1 to BPF-7.

Figure 10:
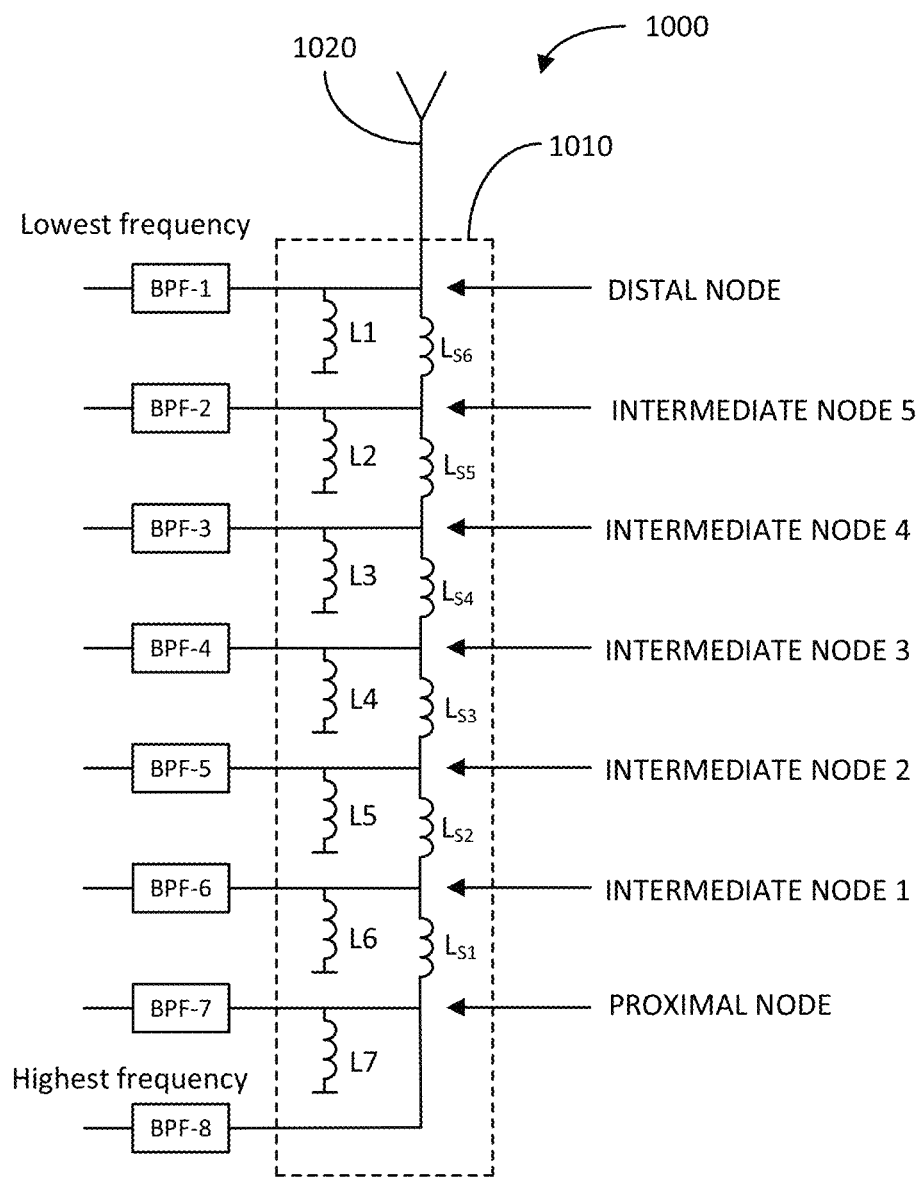
FIG. 10 illustrates a schematic diagram of another exemplary Nx-plexer of a wireless device in accordance with another aspect of the disclosure.

Accordingly, one or more shunt inductors (or more generally shunt reactance element(s) or network) may be coupled to one or more of the bandpass filters to tweak their in-band impedances (See e.g., FIG. 10). In other words, with reference again to FIG. 8A, the impedances at points 2-10 may be tweaked using shunt inductors so that all in-band impedances of the bandpass filters BPF-1 to BPF-8 substantially match the impedance of the antenna 920. Said differently, the shunt inductors move the impedance points 2-10 such that it achieves an acceptable impedance match between the bandpass filter BPF-8 and the antenna 920, as well as an acceptable impedance match between the remaining bandpass filters BPF-1 to BPF-7 and the antenna 920. A computer-driven software optimizer may be used to determine the inductance values of the set of series inductors $L_{S1}$ to $L_{S6}$ such that acceptable impedances matches can be achieved between all of the bandpass filters BPF-1 to BPF-8 and the antenna 920.

For the bandpass filter BPF-8, there are many solutions for impedance points 2-10 on the Smith chart of FIG. 8A. If the other bandpass filters BPF-1 to BPF-7 are examined, the choice of impedance points 2 to 10 is increasing limited, and the solution may be more focused when considering every bandpass filter in combination. In other words, it may not be the case that if the other bandpass filters are optimized that the optimum for bandpass filter BPF-8 is reduced.

FIG. 10 illustrates a schematic diagram of another exemplary Nx-plexer 1000 of a wireless device in accordance with another aspect of the disclosure. The Nx-plexer 1000 is a variation of the Nx-plexer 900 previously discussed. That is, the Nx-plexer 1000 includes bandpass filters BPF-1 to BPF-8 having passbands or center frequencies staggered in a positive frequency direction. As in the previous implementation, the number of bandpass filters need not be eight (8), but can be a different number. Some of the bandpass filters BPF-1 to BPF-8 may be on the transmitter-side and others on the receiver-side.

The Nx-plexer 1000 further includes an impedance matching network 1010 including a set of series inductors $L_{S1}$ to $L_{S6}$ coupled in series between a proximal node and a distal node, with intermediate nodes 1-5 separating distinct pairs of the series inductors $L_{S1}$-$L_{S2}$, $L_{S2}$-$L_{S3}$, $L_{S3}$-$L_{S4}$, $L_{S4}$-$L_{S5}$, and $L_{S5}$-$L_{S6}$, respectively. The bandpass filters BPF-8-7 to BPF-1 are coupled to the proximal node, intermediate nodes 1-5, and distal node, respectively. Again, it shall be understood that each of the series inductors $L_{S1}$ to $L_{S6}$ represents a reactive element (e.g., positive) or reactive (e.g., positive) network that is configured to perform the function of the impedance matching the bandpass filters to the antenna. Although, in this example, the proximal node is coupled to the filter furthest away from the distal node, it shall be understood that the proximal node could be defined as being one of the intermediate nodes illustrated in FIG. 10.

The antenna 1020 is coupled to the distal node, which may serve as the antenna port. Again, as previously discussed, the term "coupled" is construed to be "electrically coupled" meaning that the antenna 1020 is coupled to the distal node either directly via a physical connection of the antenna to the distal node or by way of an intervening element, such as a capacitor or transformer between the two elements.

The impedance matching network 1010 further includes a set of shunt inductors L1 to L7 (each being one or more positive-reactive elements) coupled between the distal node, intermediate nodes 1-5, and proximal node, and ground, respectively. It shall be understood that each of the shunt inductors L1 to L7 represents a reactive element (e.g., positive) or reactive (e.g., positive) network. The shunt inductors L1 to L7 allow some further tuning of the impedances of the bandpass filters BPF-1 to BPF-7 to assist in the impedance phase rotation performed by the series inductors $L_{S1}$ to $L_{S6}$, as previously discussed. In other words, the shunt inductors L1 to L7 introduce additional phase shifts that can be controlled so that impedance phase rotation performed by the impedance matching network 1010 is as desired, such as rotating the in-band characteristic impedance of bandpass filter BPF-8 substantially 360 degrees so that it is presented at the port of the antenna 1020. Although, in this example, there is shunt inductor between each node and ground, it shall be understood that one or more shunt inductors may be eliminated.

Figure 11:
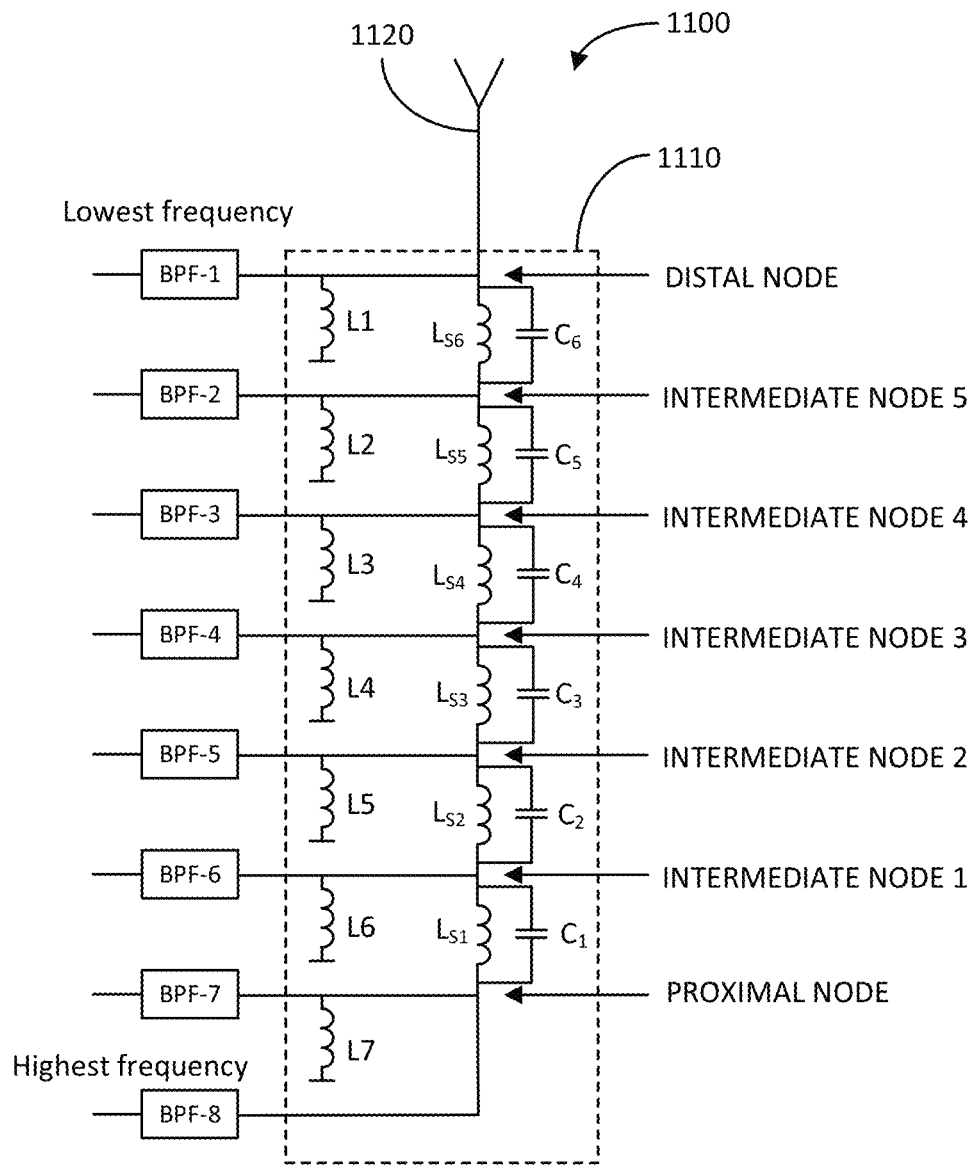
FIG. 11 illustrates a schematic diagram of another exemplary Nx-plexer of a wireless device in accordance with another aspect of the disclosure.

FIG. 11 illustrates a schematic diagram of another exemplary Nx-plexer of a wireless device in accordance with another aspect of the disclosure. The Nx-plexer 1100 is a variation of the Nx-plexer 1000 previously discussed. That is, the Nx-plexer 1100 includes bandpass filters BPF-1 to BPF-8 having passbands or center frequencies staggered in a positive frequency direction. As in the previous implementation, the number of bandpass filters need not be eight (8), but can be a different number. Some of the bandpass filters BPF-1 to BPF-8 may be on the transmitter-side and others on the receiver-side.

The Nx-plexer 1100 further includes an impedance matching network 1110 including a set of series inductors $L_{S1}$ to $L_{S6}$ (e.g., each a (e.g., positive) reactive element or network) coupled in series between a proximal node and a distal node, with intermediate nodes 1-5 separating distinct pairs of the series inductors $L_{S1}$-$L_{S2}$, $L_{S2}$-$L_{S3}$, $L_{S3}$-$L_{S4}$, $L_{S4}$-$L_{S5}$, and $L_{S5}$-$L_{S6}$, respectively. The bandpass filters BPF-8-7 to BPF-1 are coupled to the proximal node, intermediate nodes 1-5, and distal node, respectively. The antenna 1120 is coupled to the distal node, which may serve as the antenna port. Although, in this example, the proximal node is coupled to the filter furthest away from the distal node, it shall be understood that the proximal node could be defined as being one of the intermediate nodes illustrated in FIG. 11.

The impedance matching network 1110 further includes a set of shunt inductors L1 to L7 coupled between the distal node, intermediate nodes 1-5, and proximal node, and ground, respectively. The shunt inductors L1 to L7 allow some further tuning of the impedances of the bandpass filters BPF-1 to BPF-7 to assist in the impedance phase rotation performed by the series inductors $L_{S1}$ to $L_{S6}$, as previously discussed.

Additionally, the impedance matching network 1110 further includes a set of one or more capacitors $C_1$ to $C_6$ coupled in parallel with the series inductors $L_{S1}$ to $L_{S6}$, respectively. The set of capacitors $C_1$ to $C_6$ are configured to perform harmonic suppression of the signals received and transmitted via the antenna 1120. Although, in this example, there is a capacitor across each of the series inductors, it shall be understood that one or more of the capacitors $C_1$ to $C_6$ may be eliminated.

Figure 12:
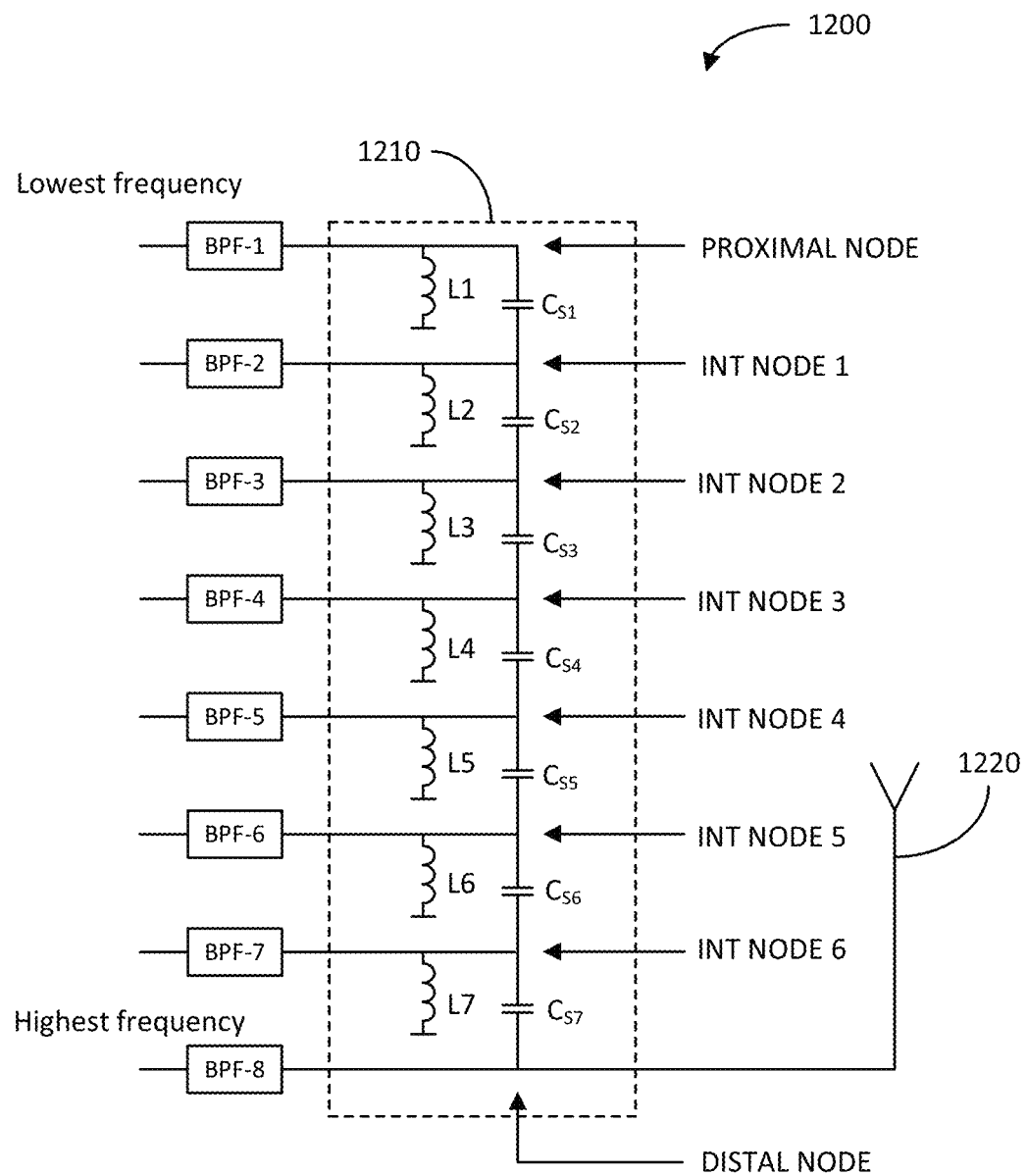
FIG. 12 illustrates a schematic diagram of another exemplary Nx-plexer of a wireless device in accordance with another aspect of the disclosure.

FIG. 12 illustrates a schematic diagram of another exemplary Nx-plexer 1200 of a wireless device in accordance with another aspect of the disclosure. The Nx-plexer previously described performed each impedance phase rotation via a series inductor with two filters on both sides of the series inductor acting as shunt capacitors. In that case, the impedance phase rotation was in the clockwise direction on a Smith chart. In contrast, the Nx-plexer 1200 performs each impedance phase rotation using a series capacitors with two shunt inductors on either side.

In particular, the Nx-plexer 1200 includes bandpass filters BPF-1 to BPF-8 having passbands or center frequencies staggered in a positive or increasing frequency direction. As in the previous implementations, the number of bandpass filters need not be eight (8), but can be a different number. Some of the bandpass filters BPF-1 to BPF-8 may be on the transmitter-side and others may be on the receiver-side.

The Nx-plexer 1200 further includes an impedance matching network 1210 with a set of series of series capacitors $C_{S1}$ to $C_{S7}$ coupled in series between a proximal node and a distal node, with intermediate nodes 1-6 separating distinct pairs of the series capacitors $C_{S1}$-$C_{S2}$, $C_{S2}$-$C_{S3}$, $C_{S3}$-$C_{S4}$, $C_{S4}$-$C_{S5}$, $C_{S5}$-$C_{S6}$, and $C_{S6}$-$C_{S7}$, respectively. It shall be understood that each of the series capacitors $C_{S1}$ to $C_{S6}$ represents a reactive element (e.g., negative) or reactive (e.g., negative) network that is configured to perform the function of the impedance matching the bandpass filters to the antenna. The bandpass filters BPF-1 to BPF-8 are coupled to the proximal node, intermediate nodes 1-6, and distal node, respectively. The antenna 1220 is coupled to the distal node, which may serve as the antenna port. Although, in this example, the proximal node is coupled to the filter furthest away from the distal node, it shall be understood that the proximal node could be defined as being one of the intermediate nodes illustrated in FIG. 12.

The impedance matching network 1210 further includes a set of shunt inductors L1 to L7 coupled between the proximal node, intermediate nodes 1-6, and distal node, and ground, respectively. It shall be understood that each of the shunt inductors L1 to L7 represents a reactive element (e.g., positive) or reactive (e.g., positive) network. In this case, each shunt inductor followed by a series capacitor inductor performs an impedance phase rotation. In this case, the shunt inductor performs a counter-clockwise rotation along a constant susceptance curve on the Smith chart. The series capacitor performs a counter-clockwise rotation along a constant reactance curve on the Smith chart.

For example, the impedance of the bandpass filter BPF-1 may be substantially at the normalized characteristic impedance (Z=1) at the center of the Smith chart. The first shunt inductor L1 rotates that impedance counter-clockwise along a constant susceptance curve; the first series capacitor $C_{S1}$ rotates the impedance counter-clockwise along a constant reactance curve; the second shunt inductor L2 further rotates that impedance counter-clockwise along a constant susceptance curve; the second series capacitor $C_{S2}$ further rotates the impedance counter-clockwise along a constant reactance curve; and so on until the cumulative phase rotation is substantially 360 degrees, and the impedance presented at the distal node or the antenna port is substantially at the normalized characteristic impedance (Z=1). Thus, the impedance matching network 1210 performs impedance match between the bandpass filters BPF-1 to BPF-N and an antenna 1220.

As discussed with reference to impedance matching network 800, the 360-degree impedance rotation occurs for the in-band of all the bandpass filters from the nodes at which the bandpass filters are connected to the distal node, respectively. In this case, the 360-degree impedance rotation is counter-clockwise, and involves alternating positive- and negative reactance changes.

Figure 13:
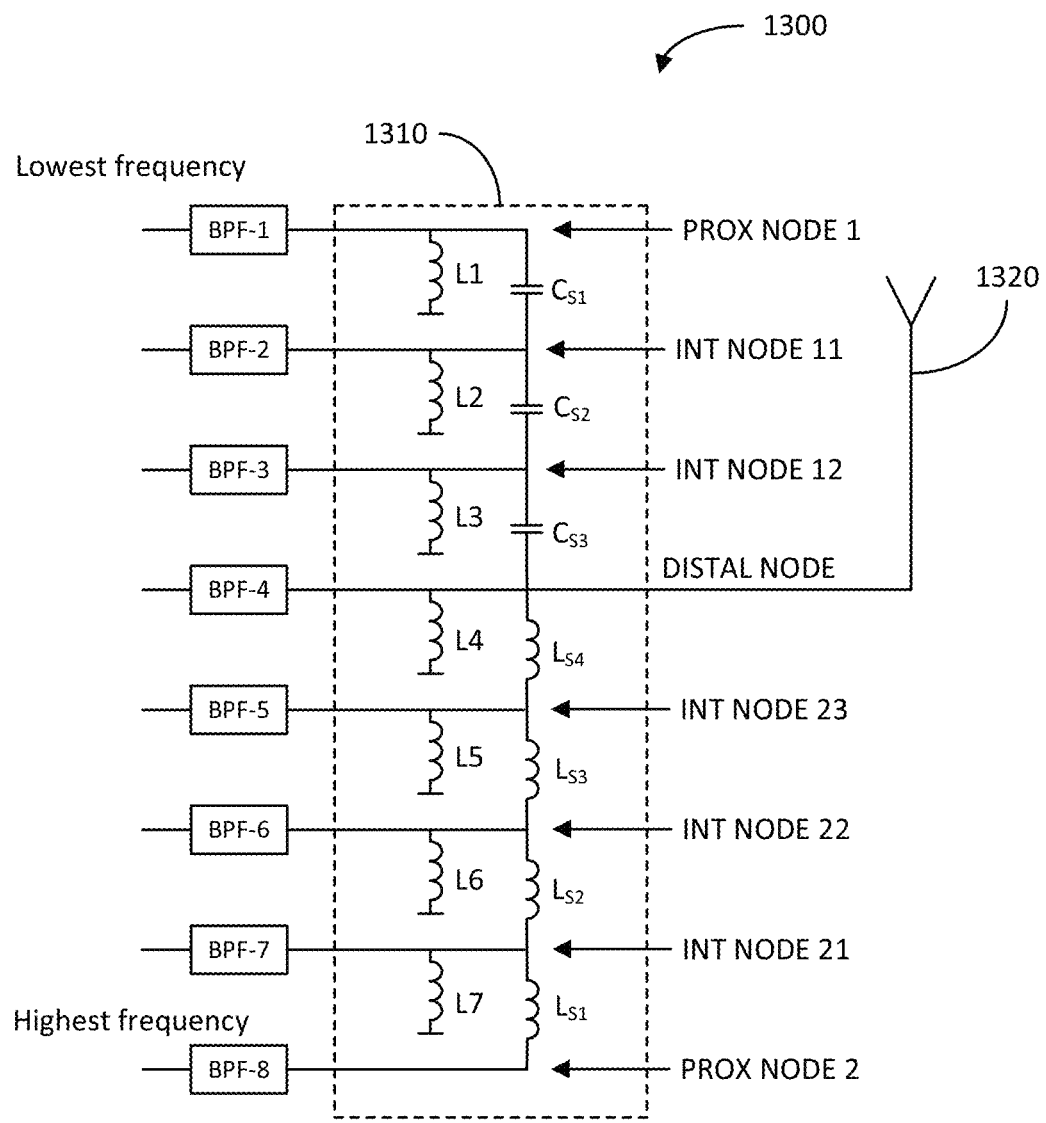
FIG. 13 illustrates a schematic diagram of another exemplary Nx-plexer of a wireless device in accordance with another aspect of the disclosure.

FIG. 13 illustrates a schematic diagram of another exemplary Nx-plexer 1300 of a wireless device in accordance with another aspect of the disclosure. The Nx-plexer 1300 is effectively a hybrid between the Nx-plexer 900 or 1000 and Nx-plexer 1200. That is, the Nx-plexer 1300 includes a set of series inductors to perform phase rotation in a clockwise manner from an in-band impedance at the highest frequency bandpass filter to the desired impedance at a distal node or antenna port. Additionally, the Nx-plexer 1300 includes a set of series capacitors to perform phase rotation in a counter-clockwise manner from an in-band impedance at the lowest frequency bandpass filter to the desired impedance at a distal node or antenna port.

In particular, the Nx-plexer 1300 includes bandpass filters BPF-1 to BPF-8 having passbands or center frequencies staggered in a positive frequency direction. As in the previous implementations, the number of bandpass filters need not be eight (8), but can be a different number. Some of the bandpass filters BPF-1 to BPF-8 may be on the transmitter-side, and others are on the receiver-side.

The Nx-plexer 1300 further includes an impedance matching network 1310 with a set of series capacitors $C_{S1}$ to $C_{S3}$ coupled in series between a first proximal node 1 and a distal node, with intermediate nodes 11 and 12 separating distinct pairs of the series capacitors $C_{S1}$-$C_{S2}$ and $C_{S2}$-$C_{S3}$, respectively. The bandpass filters BPF-1 to BPF-4 are coupled to the first proximal node 1, intermediate nodes 11 and 12, and distal node, respectively. An antenna 1320 is coupled to the distal node, which may serve as the antenna port. Although, in this example, the first and second proximal nodes are coupled to the filters furthest away from the distal node, it shall be understood that the first and second proximal nodes could be defined as respective intermediate nodes illustrated in FIG. 13.

The Nx-Plexer 1310 further includes a set of series inductors $L_{S1}$ to $L_{S4}$ coupled in series between a second proximal node 2 and the distal node, with intermediate nodes 21, 22, and 23 separating distinct pairs of the series inductors $L_{S1}$-$L_{S2}$, $L_{S2}$-$L_{S3}$, and $L_{S3}$-$L_{S4}$, respectively. The bandpass filters BPF-8 to BPF-5 are coupled to the second proximal node 2, and intermediate nodes 21, 22, and 22, respectively.

The Nx-plexer 1310 further includes a set of shunt inductors L1 to L7 coupled between the bandpass filters BPF-1 to BPF-8 and ground, respectively. In this case of shunt inductors L1-L3, these inductors in concert with the series capacitors $C_{S1}$-$C_{S3}$ substantially perform the 360-degree counter-clockwise rotation of the in-band impedance of bandpass filter BPF-1 to produce substantially the same impedance at the distal node or antenna port.

The shunt inductors L4-L7 may not be needed, but may be used to tweak the impedances of bandpass filters BPF-4 to BPF-7 so that the clockwise impedance rotation performed by the series inductors $L_{S1}$ to $L_{S4}$ in concert with the capacitive bandpass filters BPF-7 achieves substantially a 360-degree clockwise rotation of the in-band impedance of bandpass filter BPF-8 to produce substantially the same impedance at the distal node or antenna port.

Figure 14:
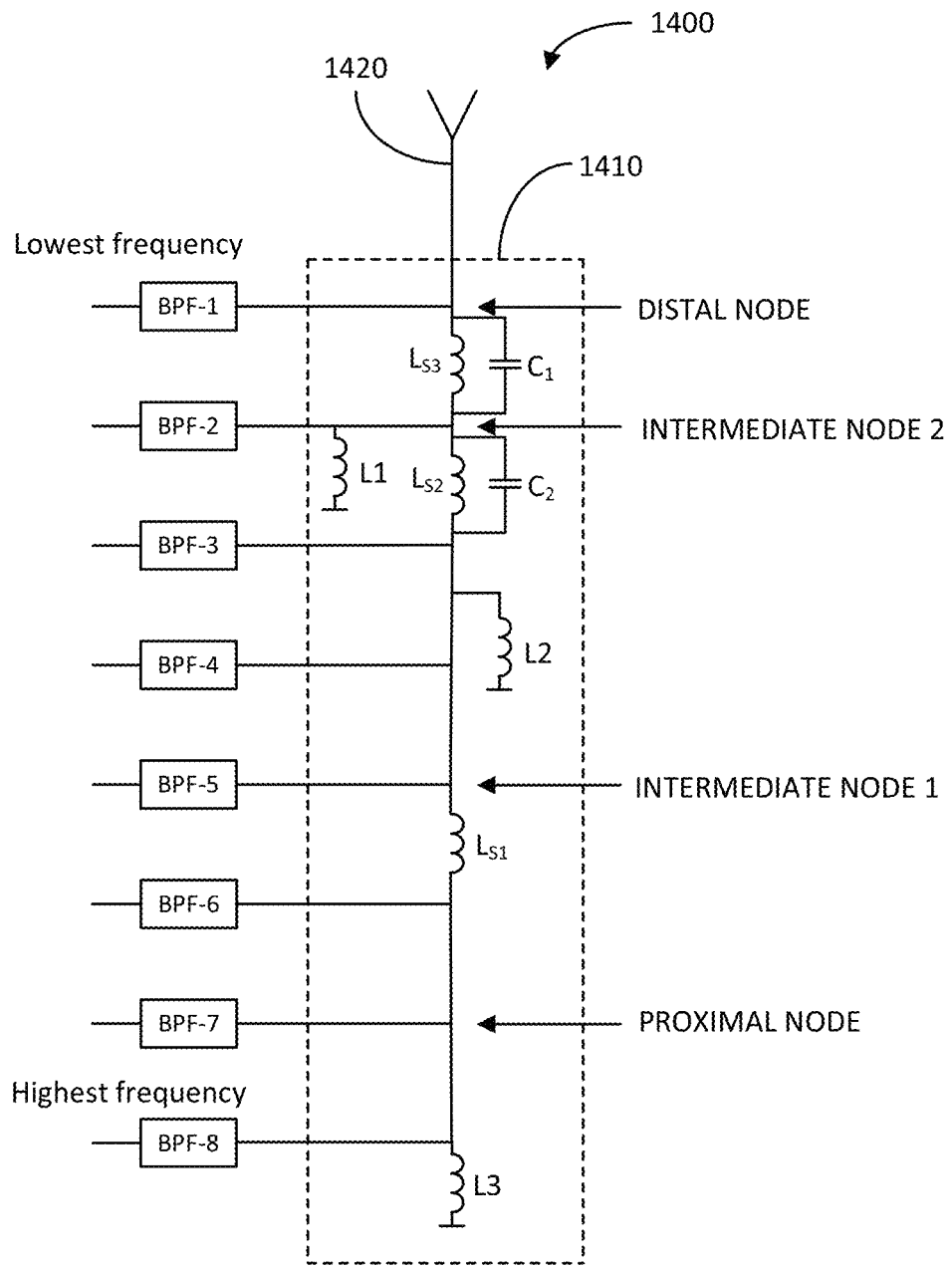
FIG. 14 illustrates a schematic diagram of another exemplary Nx-plexer of a wireless device in accordance with another aspect of the disclosure.

FIG. 14 illustrates a schematic diagram of another exemplary Nx-plexer 1400 of a wireless device in accordance with another aspect of the disclosure. The Nx-plexer 1400 includes an impedance matching network similar to impedance matching network 1110 of Nx-plexer 1100, but eliminates various components as needed to reduce component count while still achieving the desired impedance match between the bandpass filters and the antenna.

In particular, the Nx-plexer 1400 includes bandpass filters BPF-1 to BPF-8 having passbands or center frequencies staggered in a positive frequency direction. As in the previous implementations, the number of bandpass filters need not be eight (8), but can be a different number. Some of the bandpass filters BPF-1 to BPF-8 may be on the transmitter-side, and others on the receiver-side.

The Nx-plexer 1400 further includes an impedance matching network 1410 including a set of series of series inductors $L_{S1}$ to $L_{S3}$ coupled in series between a proximal node and a distal node, with intermediate nodes 1-2 separating distinct pairs of the series inductors $L_{S1}$-$L_{S2}$ and $L_{S2}$-$L_{S3}$, respectively. The bandpass filters BPF-8 to BPF-6 are coupled to the proximal node, bandpass filters BPF-5 to BPF-3 are coupled to intermediate node 1, bandpass filter BPF-2 is coupled to intermediate node 2, and bandpass filter BPF-1 is coupled to the distal node. The antenna 1420 is coupled to the distal node, which may serve as the antenna port. Although, in this example, the proximal node is coupled to the filter furthest away from the distal node, it shall be understood that the proximal node could be defined as being one of the intermediate nodes illustrated in FIG. 14.

The impedance matching network 1410 further includes a set of shunt inductors L1 to L3 coupled between intermediate nodes 2 and 1 and proximal node, and ground, respectively. The shunt inductors L1 to L3 allow some further tuning of the impedances of the bandpass filters BPF-2, BPF-3-5, and BPF-6-8 to assist in the impedance phase rotation performed by the series inductors $L_{S1}$ to $L_{S3}$, as previously discussed.

Additionally, the impedance matching network 1410 further includes a pair of capacitors $C_1$ and $C_2$ coupled in parallel with series inductors $L_{S3}$ to $L_{S2}$, respectively. The capacitors $C_1$ and $C_2$ are configured to perform harmonic suppression of the signals received and transmitted via the antenna 1420.

The exemplary configuration of the Nx-plexer 1400 demonstrates that some components, such as series inductors, harmonic-suppressing capacitors, shunt inductors, and series capacitors, from the various Nx-plexers described herein, may be eliminated to reduce component counts, and the remaining components may be tuned to achieve the desired impedance matching between the bandpass filters BPF-1 to BPF-8, and the antenna 1420.

Figure 15:
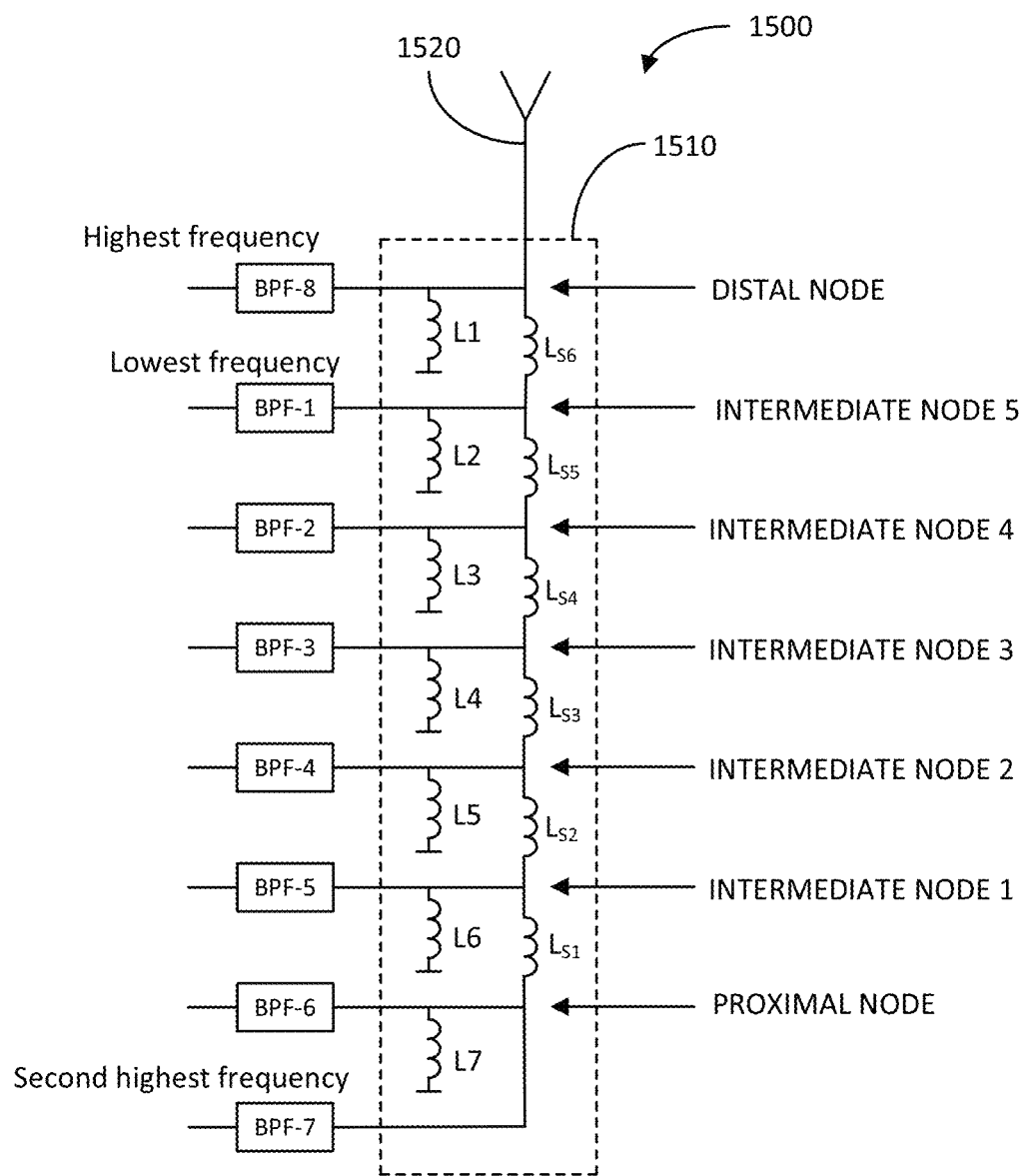
FIG. 15 illustrates a schematic diagram of another exemplary Nx-plexer of a wireless device in accordance with another aspect of the disclosure.

FIG. 15 illustrates a schematic diagram of another exemplary Nx-plexer 1500 of a wireless device in accordance with another aspect of the disclosure. The Nx-plexer 1500 is a variation of the Nx-plexer 1000 previously discussed. However, in Nx-plexer 1500, the order of the bandpass filters is slightly rearranged. In particular, the highest frequency bandpass filter BPF-8 is moved to the distal node, while the lowest-frequency bandpass filter BPF-1 to the second highest-frequency bandpass filter BPF-7 are coupled to intermediate nodes 5 to 1 and proximal node, respectively.

In particular, the Nx-plexer 1500 includes bandpass filters BPF-1 to BPF-8 having passbands or center frequencies staggered in a positive frequency direction. As in the previous implementations, the number of bandpass filters need not be eight (8), but can be a different number. Some of the bandpass filters BPF-1 to BPF-8 may be transmit filters, and others receive filters.

The Nx-plexer 1500 further includes an impedance matching network 1510 including a set of series inductors $L_{S1}$ to $L_{S6}$ coupled in series between a proximal node and a distal node, with intermediate nodes 1-5 separating distinct pairs of the series inductors $L_{S1}$-$L_{S2}$, $L_{S2}$-$L_{S3}$, $L_{S3}$-$L_{S4}$, $L_{S4}$-$L_{S5}$, and $L_{S5}$-$L_{S6}$, respectively. The bandpass filters BPF-7 and BPF-6, BPF-5 to BPF-1, and BPF-8 are coupled to the proximal node, intermediate nodes 1-5, and distal node, respectively. The antenna 1520 is coupled to the distal node, which may serve as the antenna port. Although, in this example, the proximal node is coupled to the filter furthest away from the distal node, it shall be understood that the proximal node could be defined as being one of the intermediate nodes illustrated in FIG. 15.

The impedance matching network 1510 further includes a set of shunt inductors L1 to L7 coupled between the distal node, intermediate nodes 1-5, and proximal node, and ground, respectively. The shunt inductors L1 to L7 allow some further tuning of the impedances of the bandpass filters BPF-8 and BPF-1 to BPF-6 to assist in the impedance phase rotation performed by the series inductors $L_{S1}$ to $L_{S6}$, as previously discussed.

This configuration of the Nx-plexer 1500 demonstrates that the filter order with respect to the antenna 1520 may be altered slightly, such as by putting the highest-frequency filter directly coupled to the antenna, and the lowest to second highest frequency filters at nodes successively away from the antenna 1520, respectively. This concept also applies to the Nx-plexer 1200, where, in that case, the lowest-frequency bandpass filter BPF-1 may be reordered by directly coupling it to the antenna 1220, and the remaining filters BPF-7 to BPF-2 coupled to nodes successively away from the antenna 1220, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a set of reactive elements or networks coupled in series between a proximal node and a distal node, wherein one or more intermediate nodes between the proximal node and the distal node separate one or more distinct pairs of the reactive elements or networks, respectively; and a set of filters coupled to the proximal node, the one or more intermediate nodes, and the distal node, respectively, wherein center frequencies of passbands of the filters coupled to the proximal node, the one or more intermediate nodes, and the distal node, are staggered in one frequency direction, respectively, wherein the distal node is coupled to an antenna, wherein an in-band impedance of each of the set of filters at a node at which the filter is coupled to the distal node is rotated substantially 360 degrees in phase by one or more alternating negative and positive or positive and negative reactance values produced by the reactive elements or networks and the other filters of the set of filters.

2. The apparatus of claim 1, wherein the frequency direction is a decreasing frequency direction, and wherein the reactive elements or networks comprise positive-reactive elements or networks.

3. The apparatus of claim 1, wherein the frequency direction is a decreasing frequency direction, and wherein the reactive elements or networks comprise inductors, respectively.

4. The apparatus of claim 3, further comprising one or more capacitors coupled in parallel with one or more of the inductors, respectively.

5. The apparatus of claim 1, wherein the frequency direction is a decreasing frequency direction, wherein the reactive elements or networks produce clockwise impedance rotation from a first impedance at the proximal node to a second impedance at the distal node.

6. The apparatus of claim 5, wherein the first impedance at a frequency at the proximal node is substantially the same as the second impedance at the frequency at the distal node.

7. The apparatus of claim 5, wherein the first impedance at a frequency or the second impedance at the frequency is substantially a defined characteristic impedance.

8. The apparatus of claim 7, wherein the defined characteristic impedance is 50 Ohms.

9. The apparatus of claim 1, further comprising one or more positive-reactive elements or networks coupled respectively between one or more of the proximal node, the one or more intermediate nodes, and the distal node, and ground.

10. The apparatus of claim 1, further comprising another filter coupled to the proximal node, wherein center frequencies of the passbands of the filters coupled to the proximal node differ.

11. The apparatus of claim 1, wherein the frequency direction is an increasing frequency direction, and wherein the reactive elements or networks comprise negative-reactive elements or networks.

12. The apparatus of claim 1, wherein the frequency direction is an increasing frequency direction, and wherein the reactive elements or networks comprise capacitors.

13. The apparatus of claim 1, wherein the frequency direction is an increasing frequency direction, wherein the reactive elements or networks produce counter-clockwise impedance rotation from a first impedance at the proximal node to a second impedance at the distal node.

14. The apparatus of claim 13, wherein the first impedance at a frequency at the proximal node is substantially the same as the second impedance at the frequency at the distal node.

15. The apparatus of claim 13, wherein the first impedance at a frequency or the second impedance at the frequency is substantially a defined characteristic impedance.

16. The apparatus of claim 1, wherein the set of filters include at least four (4) filters.

17. The apparatus of claim 1, wherein one or more of the filters are configured to filter a transmit signal for transmission via the antenna, and wherein one or more of the filters are configured to filter a signal received via the antenna.

18. The apparatus of claim 1, wherein two or more of the set of filters are coupled to the same intermediate node.

19. The apparatus of claim 1, wherein the passbands of the filters are non-overlapping.

20. An apparatus, comprising:
a set of filters coupled to a proximal node, one or more intermediate nodes, and a distal node, respectively; and
a set of reactive elements or networks coupled in series between the proximal node and the distal node, wherein the one or more intermediate nodes separate one or more distinct pairs of the reactive elements or networks, respectively, wherein an in-band impedance of each of the set of filters at the node at which the filter is coupled to the distal node is rotated substantially 360 degrees in phase by one or more alternating negative and positive or positive and negative reactance values produced by the reactive elements or networks and the other filters of the set of filters.

21. The apparatus of claim 20, wherein the set of reactive elements or networks comprise positive-reactive elements or networks, respectively.

22. The apparatus of claim 20, wherein the set of reactive elements or networks comprise negative-reactive elements or networks, respectively.

23. An apparatus, comprising:
a set of negative-reactive elements or networks coupled in series between a first proximal node and a distal node, wherein one or more of a first set of intermediate nodes between the first proximal node and the distal node separate one or more distinct pairs of the set of negative-reactive elements or networks, respectively;
a first set of filters coupled to the first proximal node, the one or more intermediate nodes of the first set, and the distal node, respectively, wherein center frequencies of passbands of the first set of filters coupled to the first proximal node, the one or more intermediate nodes of the first set, and the distal node, are staggered in a positive frequency direction;
a set of positive-reactive elements or networks coupled in series between a second proximal node and the distal node, wherein one or more of a second set of intermediate nodes between the second proximal node and the distal node separate one or more distinct pairs of the set of positive-reactive elements or networks, respectively; and
a second set of filters coupled to the second proximal node and the one or more intermediate nodes of the second set, respectively, wherein center frequencies of passbands of the second set of filters coupled to the second proximal node and the one or more intermediate nodes are staggered in a negative frequency direction, wherein the distal node is coupled to an antenna.

24. The apparatus of claim 23, wherein reactance values of the negative-reactive elements or networks are configured to perform a substantially 360-degree impedance rotation at a frequency from a first impedance at the first proximal node to a second impedance at the distal node.

25. The apparatus of claim 23, wherein reactance values of the positive-reactive elements or networks are configured to perform a substantially 360-degree impedance rotation at a frequency from a first impedance at the second proximal node to a second impedance at the distal node.

26. A method, comprising:
transforming a first impedance at a proximal node to a second impedance at a distal node by a set of clockwise impedance rotations performed by a set of positive-reactive elements or networks or counter-clockwise impedance rotations performed by a set of negative-reactive elements or networks, the set of clockwise or counter-clockwise impedance rotations performed between the proximal node and one of a set of intermediate nodes, between one or more distinct pairs of the set of intermediate nodes, and between another of the intermediate nodes and the distal node, wherein a cumulative impedance rotation of the set of clockwise or counter-clockwise impedance rotations between the first impedance and the second impedance is substantially 360 degrees; and
filtering signals to be transmitted or received from an antenna via the proximal node, the set of intermediate nodes, and the distal node, respectively.

27. An apparatus, comprising:
a set of reactive elements or networks coupled in series between a proximal node and a distal node, wherein one or more intermediate nodes between the proximal node and the distal node separate one or more distinct pairs of the reactive elements or networks, respectively; and
a set of filters coupled to the proximal node, the one or more intermediate nodes, and the distal node, respectively, wherein center frequencies of passbands of the filters coupled to the proximal node, the one or more intermediate nodes, and the distal node, are staggered in one frequency direction, respectively, wherein the distal node is coupled to an antenna, wherein the frequency direction is at least one of:
a decreasing frequency direction where the reactive elements or networks produce a clockwise impedance rotation from a first impedance at the proximal node to a second impedance at the distal node; or
an increasing frequency direction where the reactive elements or networks produce a counter-clockwise impedance rotation from the first impedance at the proximal node to the second impedance at the distal node,
wherein the first impedance at a frequency at the proximal node is substantially the same as the second impedance at the frequency at the distal node, wherein the first impedance at the frequency or the second impedance at the frequency is substantially a defined characteristic impedance.

28. The apparatus of claim 27, wherein the defined characteristic impedance is 50 Ohms.

* * * * *